United States Patent
Dutta et al.

(10) Patent No.: US 9,842,657 B1
(45) Date of Patent: Dec. 12, 2017

(54) MULTI-STATE PROGRAM USING CONTROLLED WEAK BOOSTING FOR NON-VOLATILE MEMORY

(71) Applicant: SANDISK TECHNOLOGIES LLC, Plano, TX (US)

(72) Inventors: Deepanshu Dutta, Fremont, CA (US); Xiaochang Miao, Fremont, CA (US); Muhammad Masuduzzaman, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/599,243

(22) Filed: May 18, 2017

(51) Int. Cl.
*G11C 16/06* (2006.01)
*G11C 16/34* (2006.01)
*G11C 16/04* (2006.01)
*G11C 16/10* (2006.01)
*G11C 16/26* (2006.01)
*G11C 16/24* (2006.01)

(52) U.S. Cl.
CPC ...... *G11C 16/3459* (2013.01); *G11C 16/0483* (2013.01); *G11C 16/10* (2013.01); *G11C 16/24* (2013.01); *G11C 16/26* (2013.01)

(58) Field of Classification Search
CPC ..... G11C 16/10; G11C 16/26; G11C 16/3427; G11C 16/3454
See application file for complete search history.

(56) References Cited

U.S. PATENT DOCUMENTS

| | | | |
|---|---|---|---|
| 7,023,733 B2 | 4/2006 | Guterman | |
| 7,088,621 B2 | 8/2006 | Guterman | |
| 9,218,874 B1 * | 12/2015 | Koh | G11C 11/5628 |
| 9,236,128 B1 * | 1/2016 | Louie | H01L 27/1157 |
| 2007/0258286 A1 | 11/2007 | Higashitani | |
| 2007/0297247 A1 | 12/2007 | Hemink | |
| 2009/0059670 A1 * | 3/2009 | Maejima | G11C 16/08 365/185.18 |
| 2011/0235420 A1 * | 9/2011 | Sharon | G11C 11/5642 365/185.17 |
| 2013/0070531 A1 * | 3/2013 | Zhao | G11C 11/5628 365/185.17 |
| 2016/0055911 A1 * | 2/2016 | Nguyen | G11C 16/10 365/185.17 |
| 2016/0141301 A1 | 5/2016 | Mokhlesi | |
| 2016/0314844 A1 | 10/2016 | Dutta | |
| 2017/0117046 A1 * | 4/2017 | Yano | G11C 16/0483 |

* cited by examiner

*Primary Examiner* — Tuan T Nguyen
(74) *Attorney, Agent, or Firm* — Vierra Magen Marcus LLP

(57) ABSTRACT

Multi-state programming of non-volatile memory cells, where cells being programmed to different target states are programmed concurrently, is performed by modulating the program speed of each state using a controlled amount of state-dependent weak boosting in their respective channels. In one example, the channel boosting is controlled by using a multi-stair word line ramp in conjunction with raising of the voltage on bit lines at a time based on the corresponding memory cell's target state.

20 Claims, 24 Drawing Sheets

Figure 1

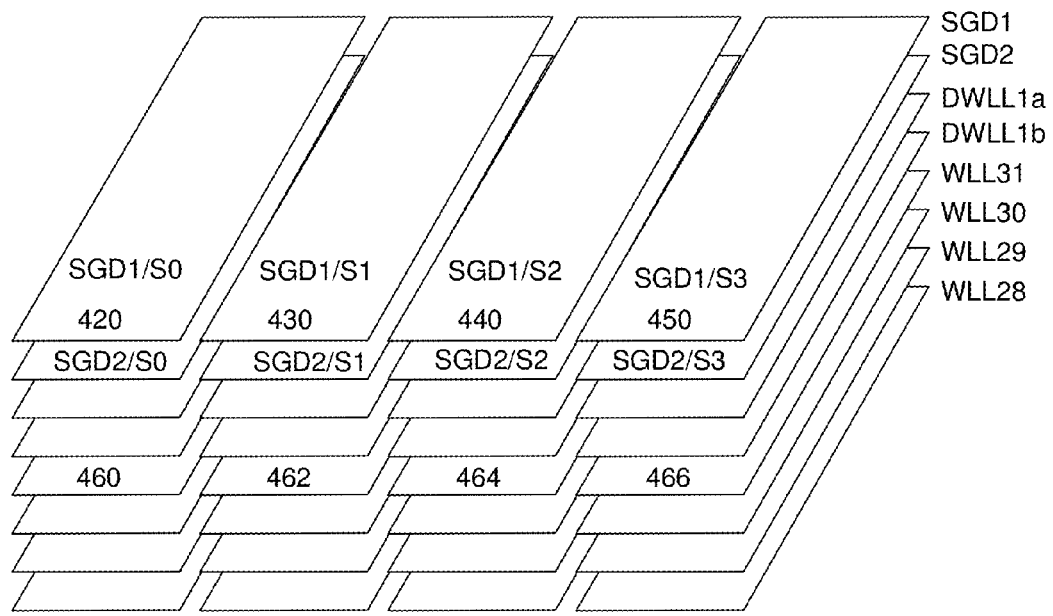
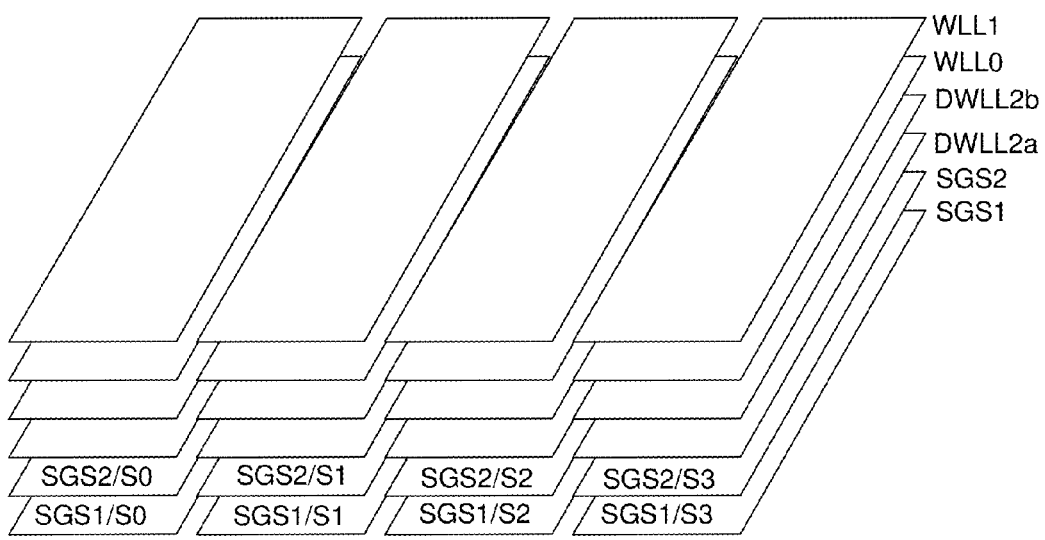
Figure 4D

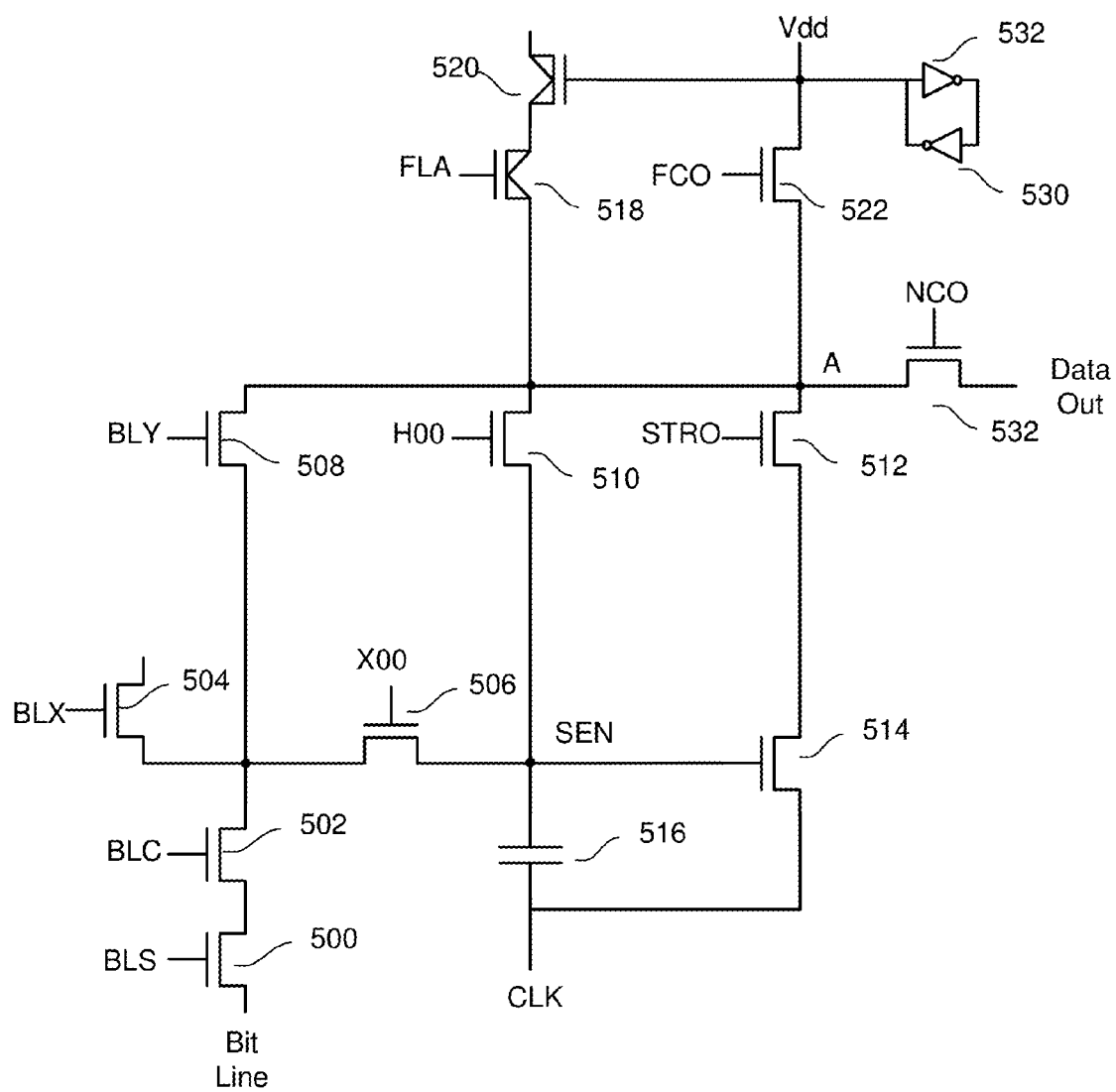

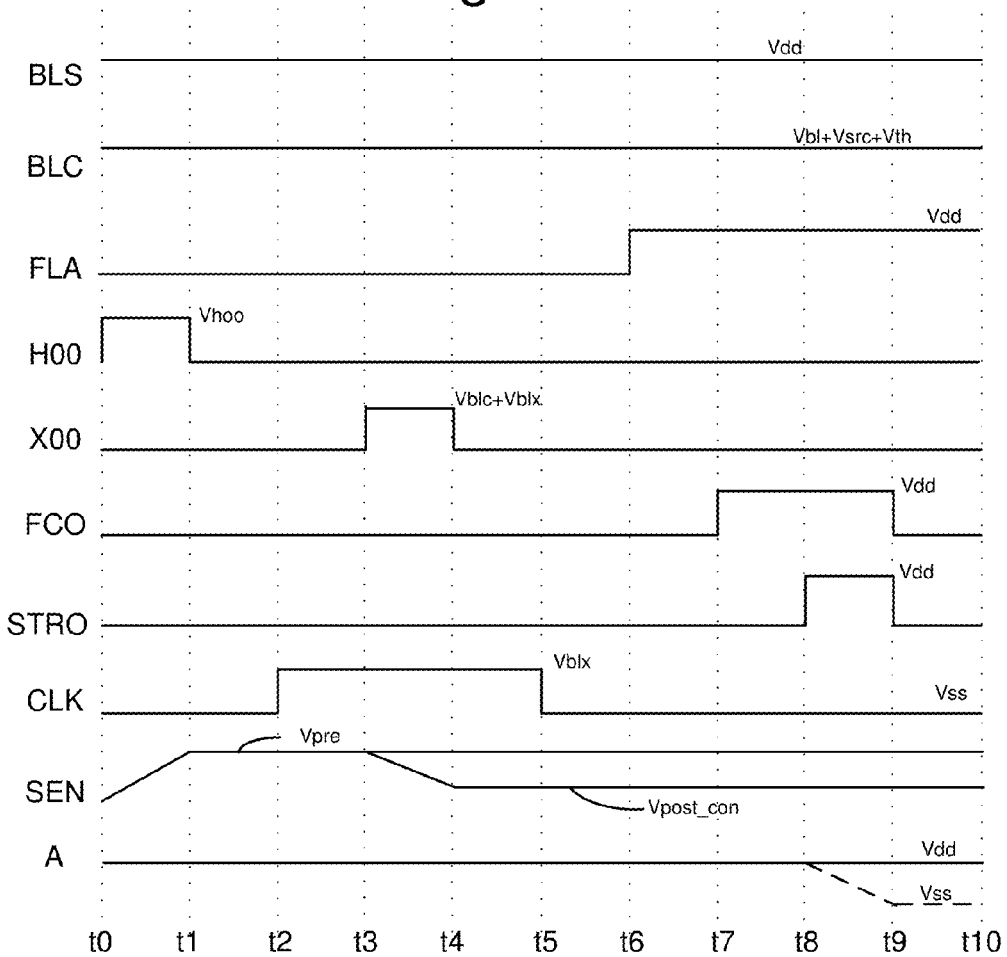
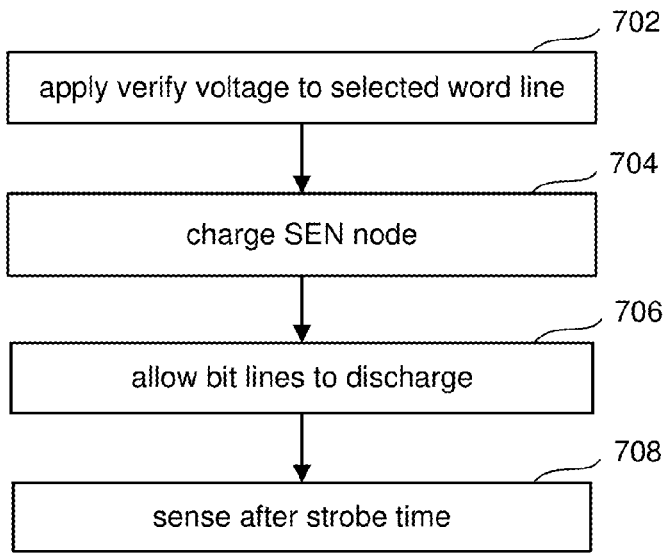

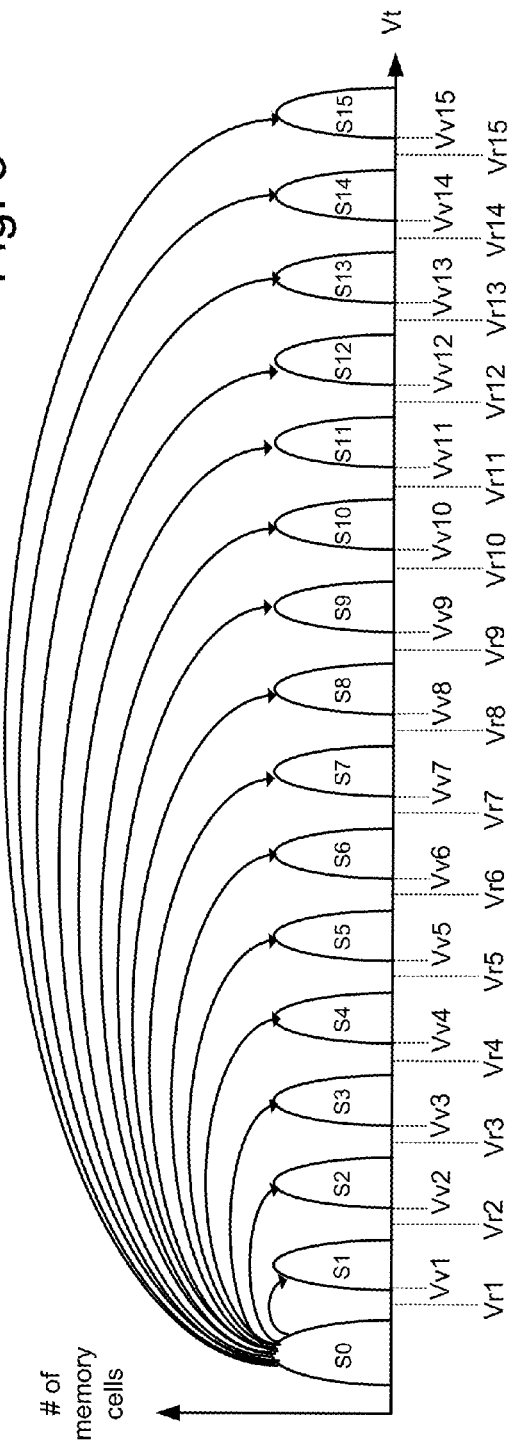
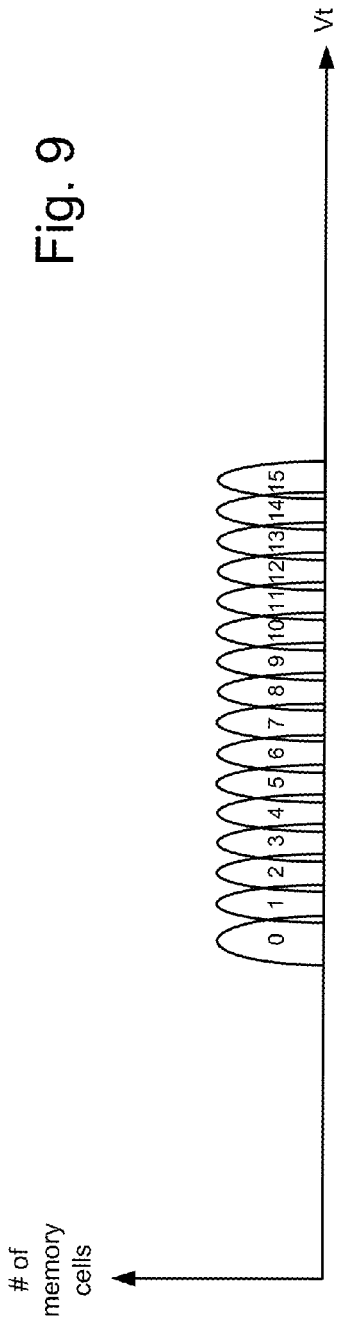

| State=> | S0* | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Vchannel | ~10V | 5.6V | 5.2V | 4.8V | 4.4V | 4.0V | 3.6V | 3.2V | 2.8V | 2.4V | 2.0V | 1.6V | 1.2V | 0.8V | 0.4V | 0V |
| Effective (VPGM=20V) | ~10V | 14.4V | 14.8V | 15.2V | 15.6V | 16.0V | 16.4V | 16.8V | 17.2V | 17.6V | 18.0V | 18.4V | 18.8V | 19.2V | 19.6V | 20V |

US 9,842,657 B1

MULTI-STATE PROGRAM USING CONTROLLED WEAK BOOSTING FOR NON-VOLATILE MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state non-volatile memory is implemented by identifying multiple, distinct allowed ranges of threshold voltages. Each distinct range of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells.

A programming operation for non-volatile memory typically includes applying doses of programming and verifying the programming after each dose of programming. While multi-state non-volatile memory can store more data states than binary non-volatile memory, the process for programming and verifying the programming can take longer for multi-state non-volatile memory.

BRIEF DESCRIPTION OF THE DRAWINGS

Like-numbered elements refer to common components in the different figures.

FIG. 4D depicts a view of the select gate layers and word line layers.

FIG. 5 is a schematic diagram of a sense amplifier.

FIG. 6 is a timing diagram that describes the behavior of certain signals depicted in the sense amplifier of FIG. 5.

FIG. 7 is a flow chart describing one embodiment of the operation of the circuit of FIG. 5.

FIGS. 8 and 9 depict threshold voltage distributions.

DETAILED DESCRIPTION

In multi-state programming, where memory cells are concurrently programmed to multiple target states, a typical program operation for NAND memory sets the selected bit lines to ground and the non-selected bit lines to a program inhibit voltage; raises the word lines from ground to Vpass; and then applies the programming pulse to the selected word line of the biased array. As all the cells program at around the same rate, this means that the lowest states can finish much sooner than the highest states. For example, in a four-bit per cell arrangement, the programming of the lowest state may finish after around, say, a dozen pulses, while the highest state may take to something like 40 pulses.

The techniques described below allow for all the cells to program in about the same number of pulses, regardless of the target state, so that they all finish at, say, ~12 pulses. This is done by, prior to applying the pulse to the selected word line, using a biasing procedure for the array where the channel of each selected memory cell is raised by some amount which is dependent upon its target state. For instance, a cell going to a low target state will have its channel raised more than a cell going to a higher target state, to thereby reduce the low target state cell's effective pulse.

Instead of taking word lines of the NAND strings directly from ground to the program-pass voltage (Vpass) used for non-selected word lines, word lies are instead raised in a series of steps (one step per target state in a full version), and then each bit line is raised to a level sufficient to shut off the select gate at one of these steps. The step chosen depends on the corresponding cell's target state. Once the select gate is shut off, the channel is left to float, and in turn gets pulled up by the word lines at the subsequent steps up to Vpass: the sooner the select gate is shut off, the more the channel gets pulled by the remaining steps, and the slower that the cell will program relative to cells whose select gate is shut off on later steps.

Figure 1:
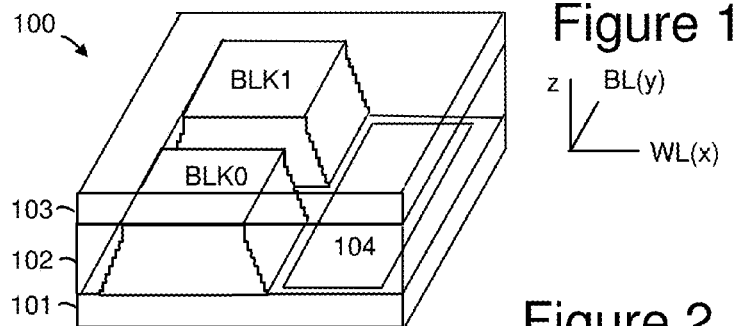
FIG. 1 is a perspective view of a 3D stacked non-volatile memory device.

FIG. 1 is a perspective view of a three dimensional (3D) stacked non-volatile memory device that can implement the technology proposed herein. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
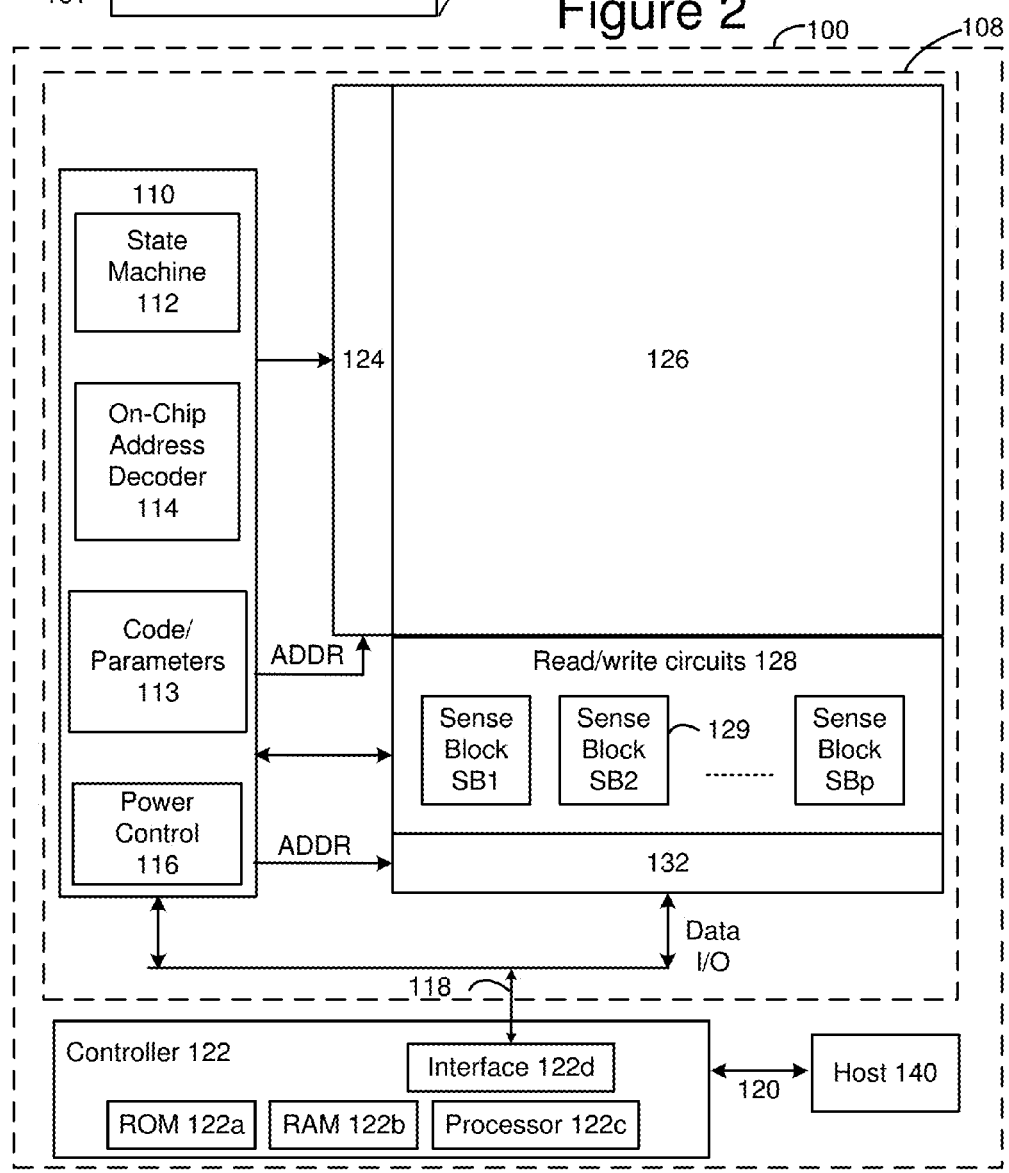
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, ... , SBp 129 (sensing circuitry) and allow a page of memory cells to be read or programmed in parallel.

In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below, whether in a 3D or 2D configuration), select transistors (e.g., SGS and SGD transistors, described below) and source lines. In particular, the power control module can include the word line drivers that serve as the biasing circuitry for the word lines in the various memory operations described below. Power control module 116 may include charge pumps for creating voltages. The sense blocks include bit line drivers, including the bit line drivers that serve as the biasing circuitry for the bit lines in the various memory operations described below. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, ... , SBp, read/write circuits 128, and controller 122 can be considered a control circuit that performs the functions described herein.

The (on-chip or off-chip) controller 122 may comprise storage devices (such as ROM 122a and RAM 122b), a processor 122c and memory interface 122d. The storage devices store code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines.

Memory interface 122*d*, in communication with ROM 122*a*, RAM 122*b* and processor 122*c*, is an electrical circuit that provides an electrical interface between controller 122 and memory die 108. For example, memory interface 122*d* can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. A NAND flash memory array may be configured so that the array is composed of multiple NAND strings of which a NAND string is composed of multiple memory cells sharing a single bit line and accessed as a group. In one embodiment, NAND strings are grouped into blocks. Within a block, one end of each NAND string is connected to one of a plurality of bit lines and the other end of each NAND string is connected to a common source line for all NAND strings in the bock. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

The technology described herein can also be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM).

One example of a ReRAM memory includes reversible resistance-switching elements arranged in cross point arrays accessed by X lines and Y lines (e.g., word lines and bit lines). Programming can be supplied by a series of voltage pulses (i.e. doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (i.e. the dose of programming). This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that this technology is not limited to a single specific memory structure, but covers many relevant memory structures within the spirit and scope of the technology as described herein and as understood by one of ordinary skill in the art.

Figure 3A:
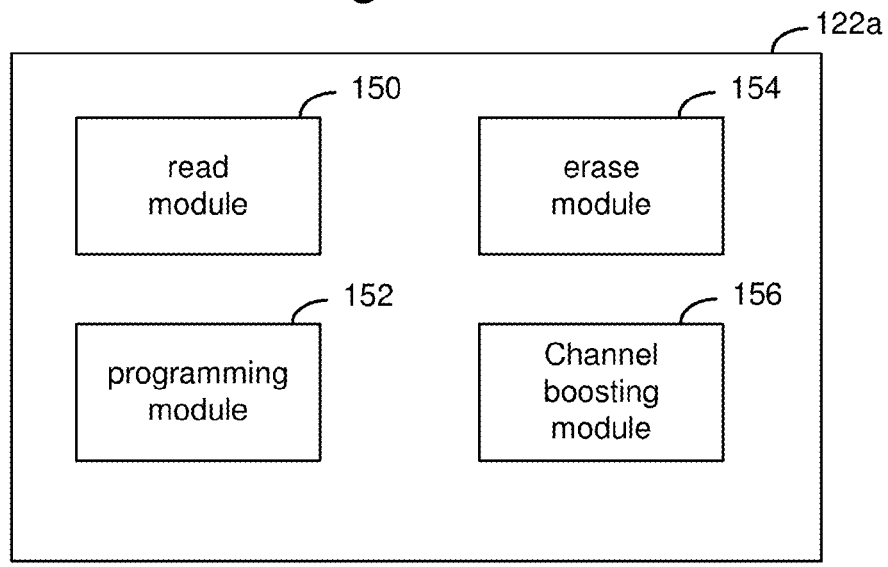
FIG. 3A is a block diagram depicting software modules for programming one or more processors in a Controller.

FIG. 3A is a block diagram depicting software modules for programming one or more processors in controller 122. FIG. 3A depicts read module 150, programming module 152, erase module 154 and channel boosting module 156 being stored in ROM 122a. These software modules can also be stored in RAM or memory die 108. Read module 150 includes software that programs processor(s) 122C to perform read operations. Programming module 152 includes software that programs processor(s) 122C to perform programming operations (including verification of programming) Erase module 154 includes software that programs processor(s) 122c to perform erase operations Channel boosting module 156 includes software that programs processor(s) 122c to perform the weak boosting of the channel (e.g., causing the channel of memory cells being programmed to be boosted by an amount dependent on the cells target state) described below. Based on the software, controller 122 instructs memory die 108 to perform memory operations.

Figure 3B:
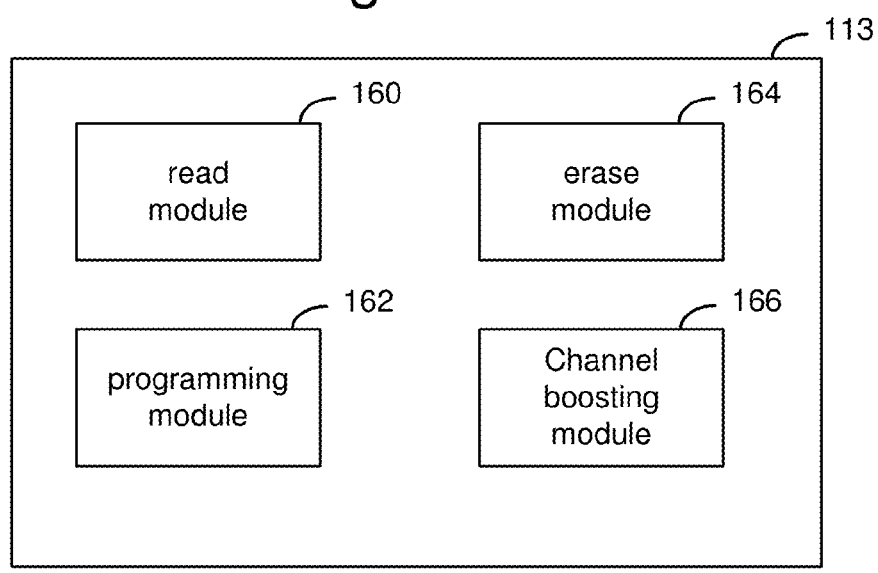
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, erase module 164 and channel boosting module 166 being stored in code and parameter storage 113. These software modules can also be stored in RAM or in memory structure 126. Read module 160 includes software that programs state machine 112 to perform read operations. Programming module 152 includes software that programs state machine 112 to perform programming operations (including verification of programming). Erase module 164 includes software that programs state machine 112 to perform erase operations Channel boosting module 166 includes software that programs state machine 112 to perform the weak boosting of the channel (e.g., causing the channel of memory cells being programmed to be boosted by an amount dependent on the cells target state) described below. Alternatively, state machine 112 (which is an electronic circuit) can be completely implemented with hardware so that no software is needed to perform these functions.

Figure 3C:
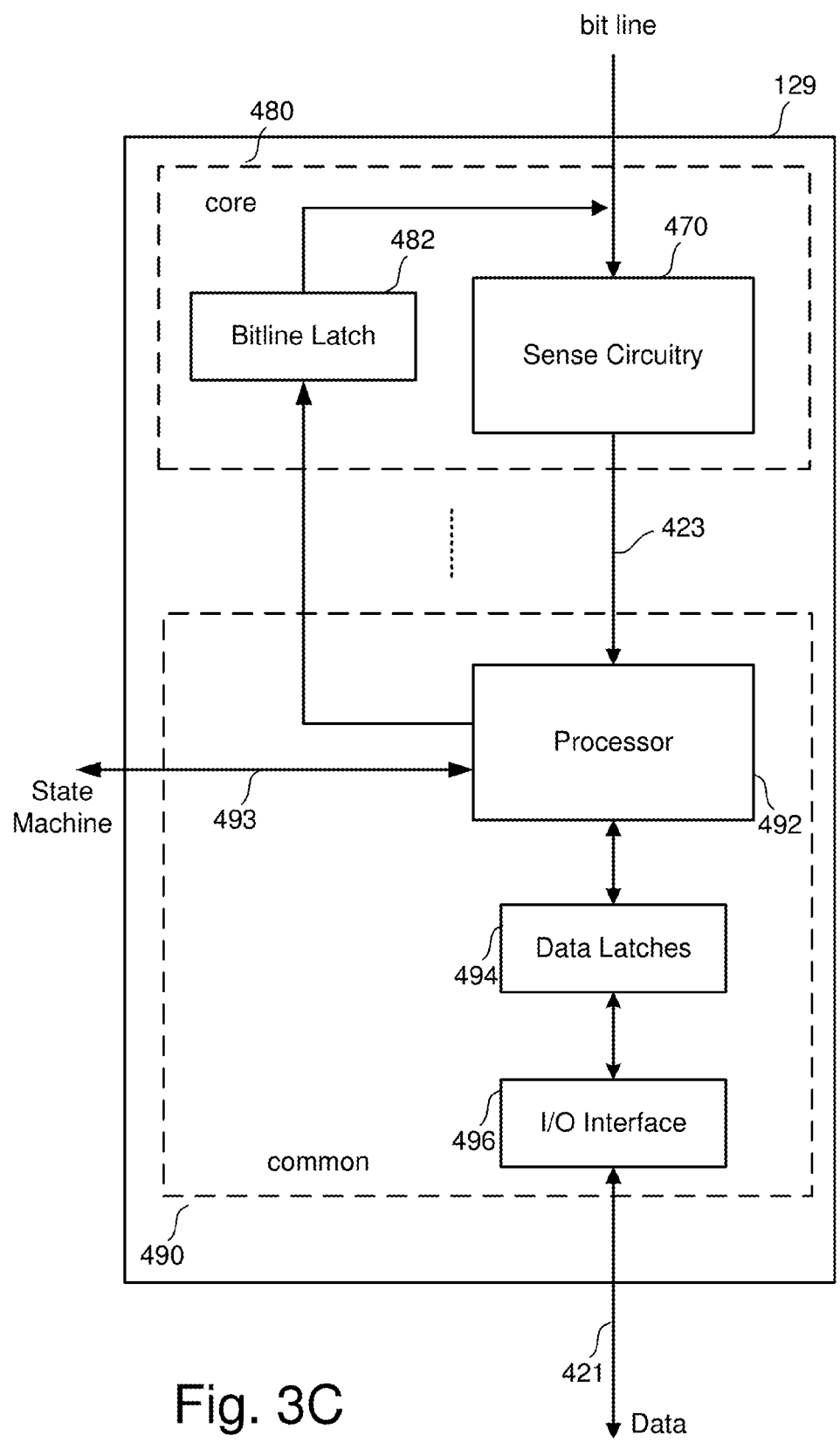
FIG. 3C is a block diagram of an individual sense block.

FIG. 3C is a block diagram of an individual sense block 129 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 423.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 421. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 421 during a program operation. The imported data bits represent write data meant to be programmed into the memory. I/O interface 496 provides an interface between data latches 494 and the data bus 421.

During read or sensing, the operation of the system is under the control of state machine 112 that controls the supply of different voltages to the addressed memory cell. As it steps through the various predefined voltages (the read reference voltages or the verify reference voltages) corresponding to the various memory states supported by the memory, the sense module 480 may trip at one of these voltages and an output will be provided from sense module 480 to processor 492 via bus 423. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 3C) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 421. The program operation, under the control of the state machine, comprises a series of programming voltage pulses (with increasing magnitudes) concurrently applied to the addressed memory cells to that the memory cells are programmed at the same time. Each programming pulse is followed by a verify process to determine if the memory cell has been programmed to the desired state. Processor 492 monitors the verified memory state relative to the desired memory state. When the two agree, processor 492 sets the bit line latch 482 so as to cause the bit line to be pulled to a state designating program inhibit. This inhibits the memory cell coupled to the bit line from further programming even if it is subjected to programming pulses on its control gate. In other embodiments, the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 421, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 4A:
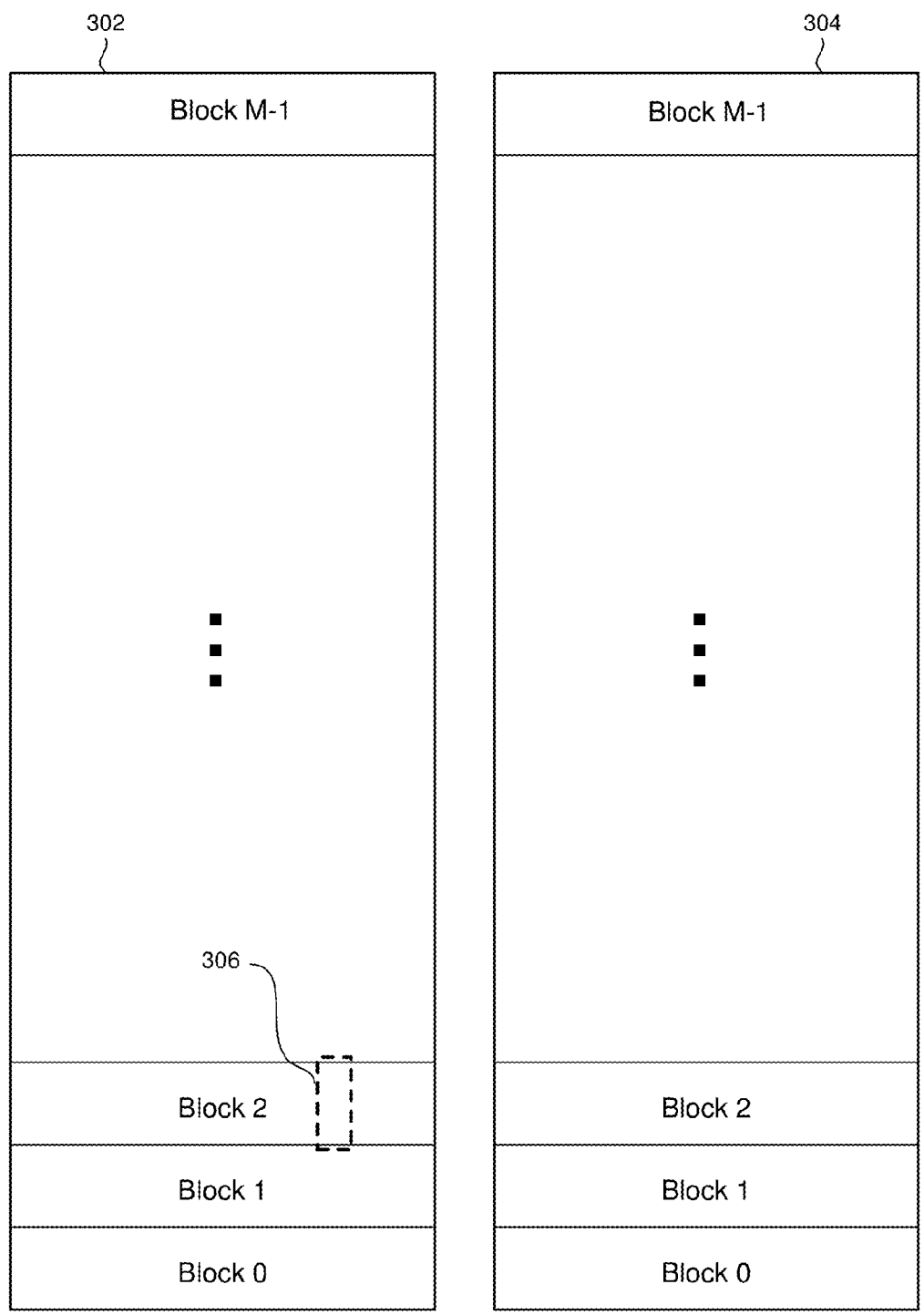
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
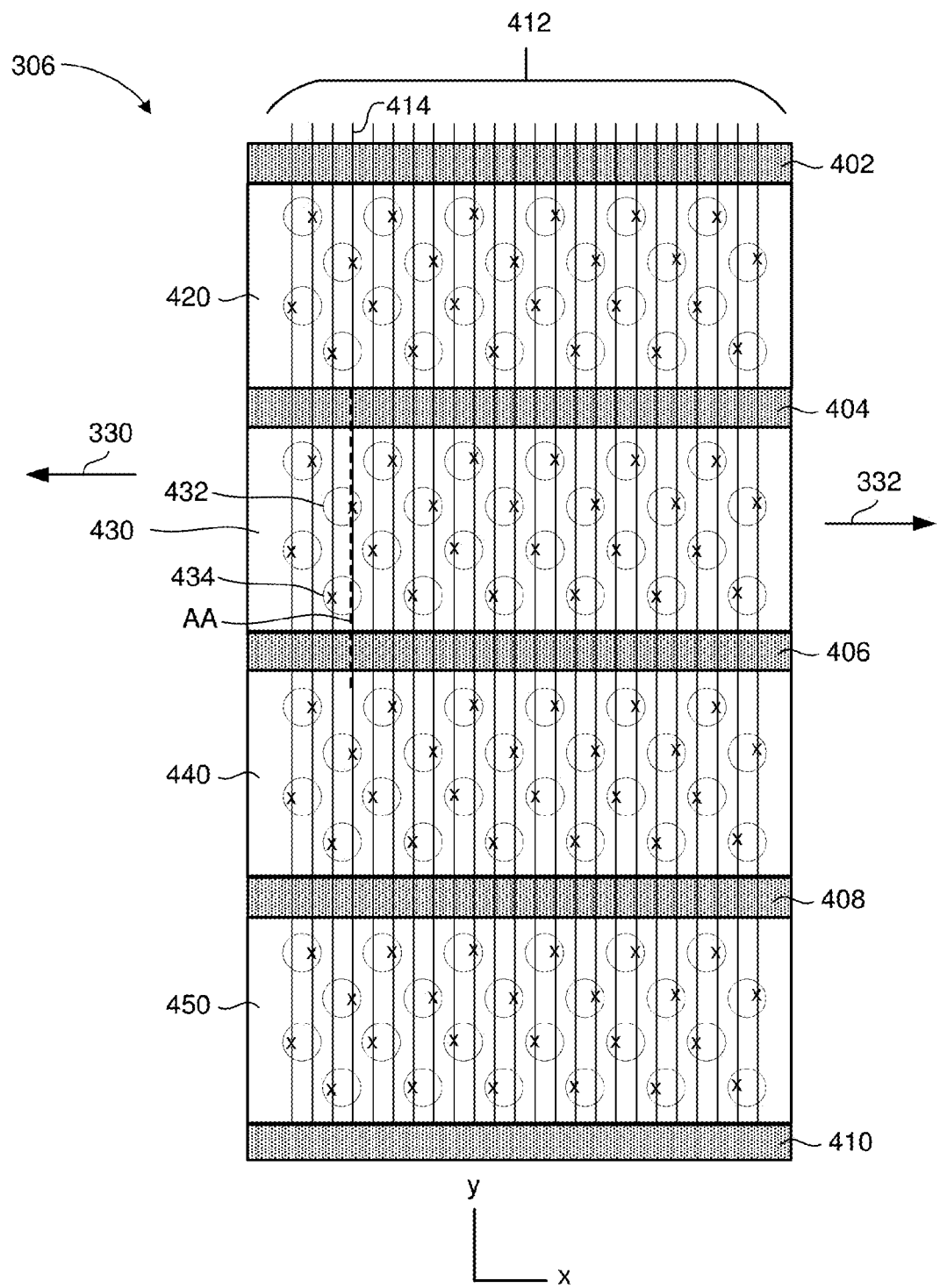
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
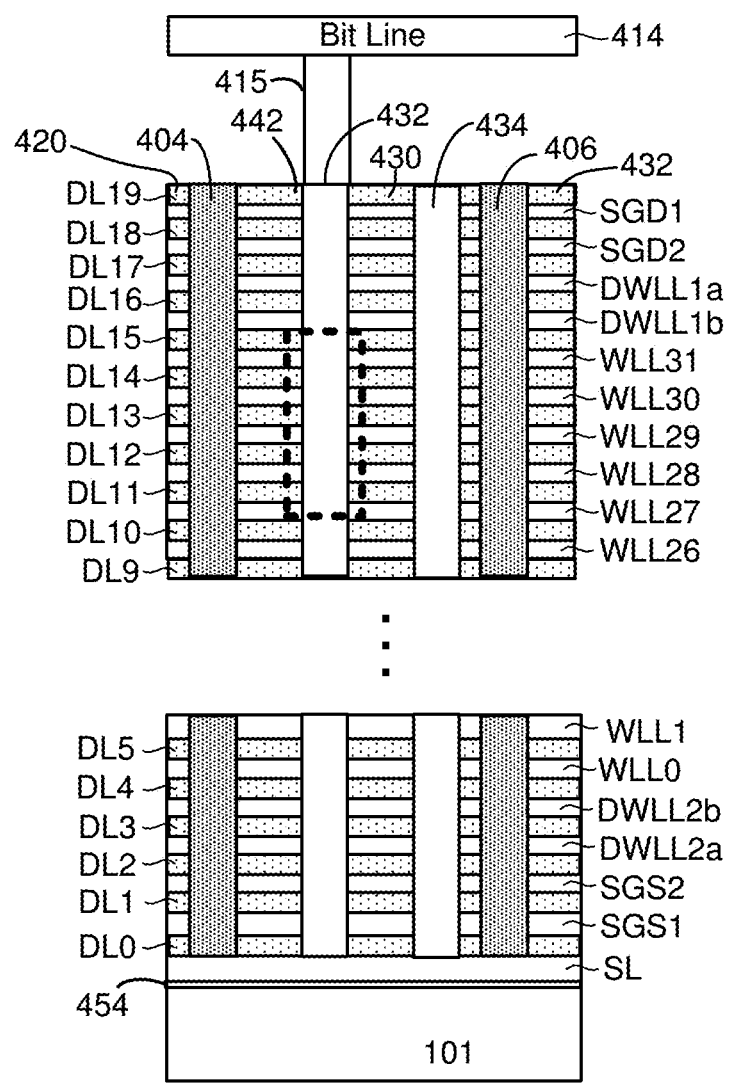
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4D depicts a perspective view of the conductive layers (SGD1, SGD2, SGS1, SGS2; DWLL1a, DWLL1b, DWLL2a, DWLL2b, and WLL0-WLL31) for the block that is partially depicted in FIG. 4C. As mentioned above with respect to FIG. 4B, local interconnects 401, 404, 406, 408 and 410 break up each conductive layer into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466. In one embodiment, each word line finger operates as a separate word line. In another embodiment, the four word line fingers on a same level are connected together.

Drain side select gate layer SGD1 (the top layer) is also divided into regions 420, 430, 440 and 450, also known as fingers or select line fingers. In one embodiment, each of the select line finger operates as a separate word line; therefore, region 420 is labeled as select line SGD1/S0 (i.e. select line 0 of drain side select line layer 0), region 430 is labeled as select line SGD1/S1 (i.e. select line 1 of drain side select line layer 0), region 440 is labeled as select line SGD1/S2, and region 450 is labeled as select line SGD1/S3. Similarly, drain side select gate layer SGD2 has four fingers that operate as select lines SGD2/S0, SGD2/S1, SGD2/S2, and SGD2/S3. Source side select gate layer SGS1 has four fingers that operate as select lines SGS1/S0, SGS1/S1, SGS1/S2, and SGS1/S3. Source side select gate layer SGS2 has four fingers that operate as select lines SGS2/S0, SGS2/S1, SGS2/S2, and SGS2/S3.

Figure 4E:
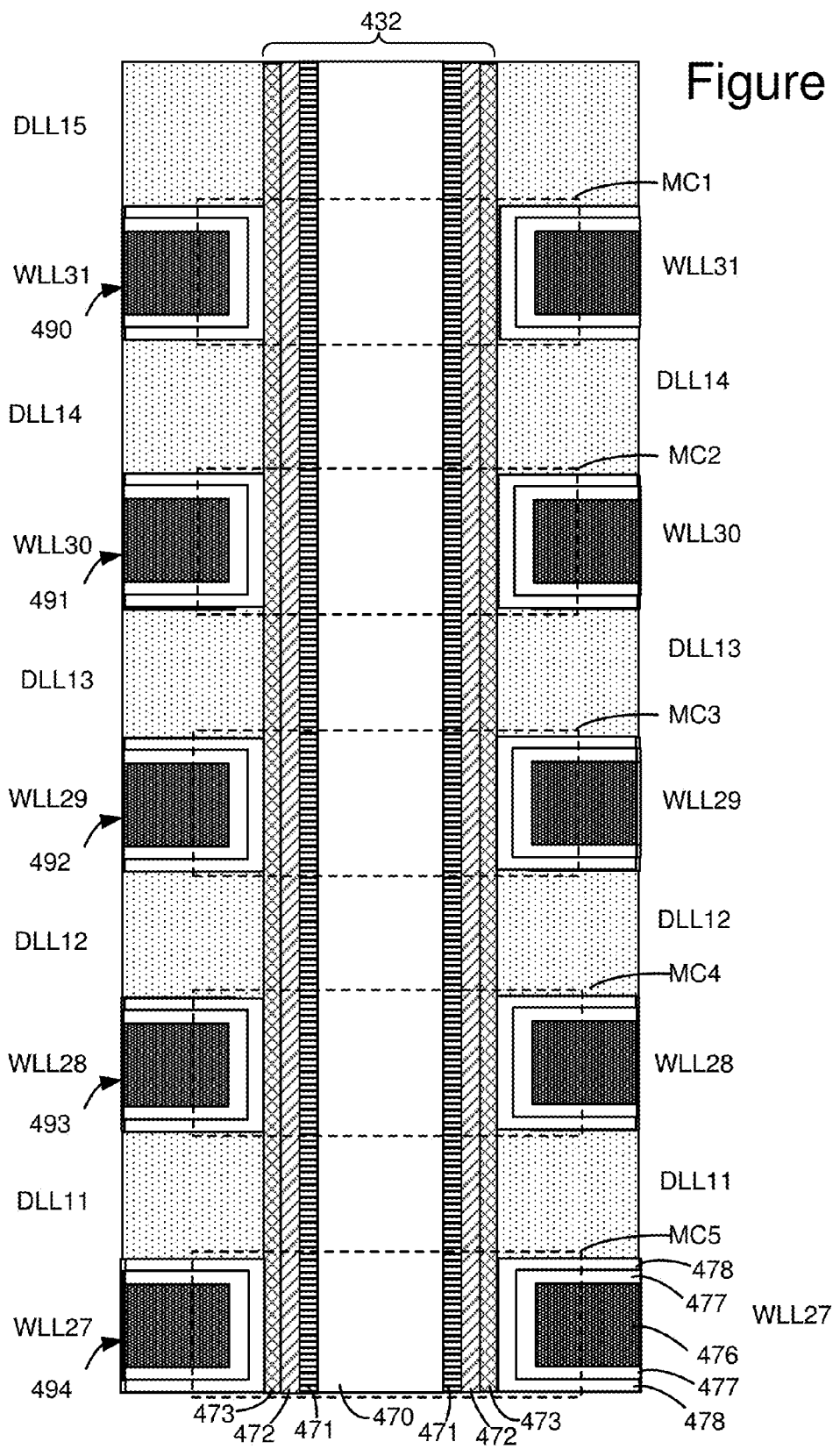
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO$_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

Figure 4F:
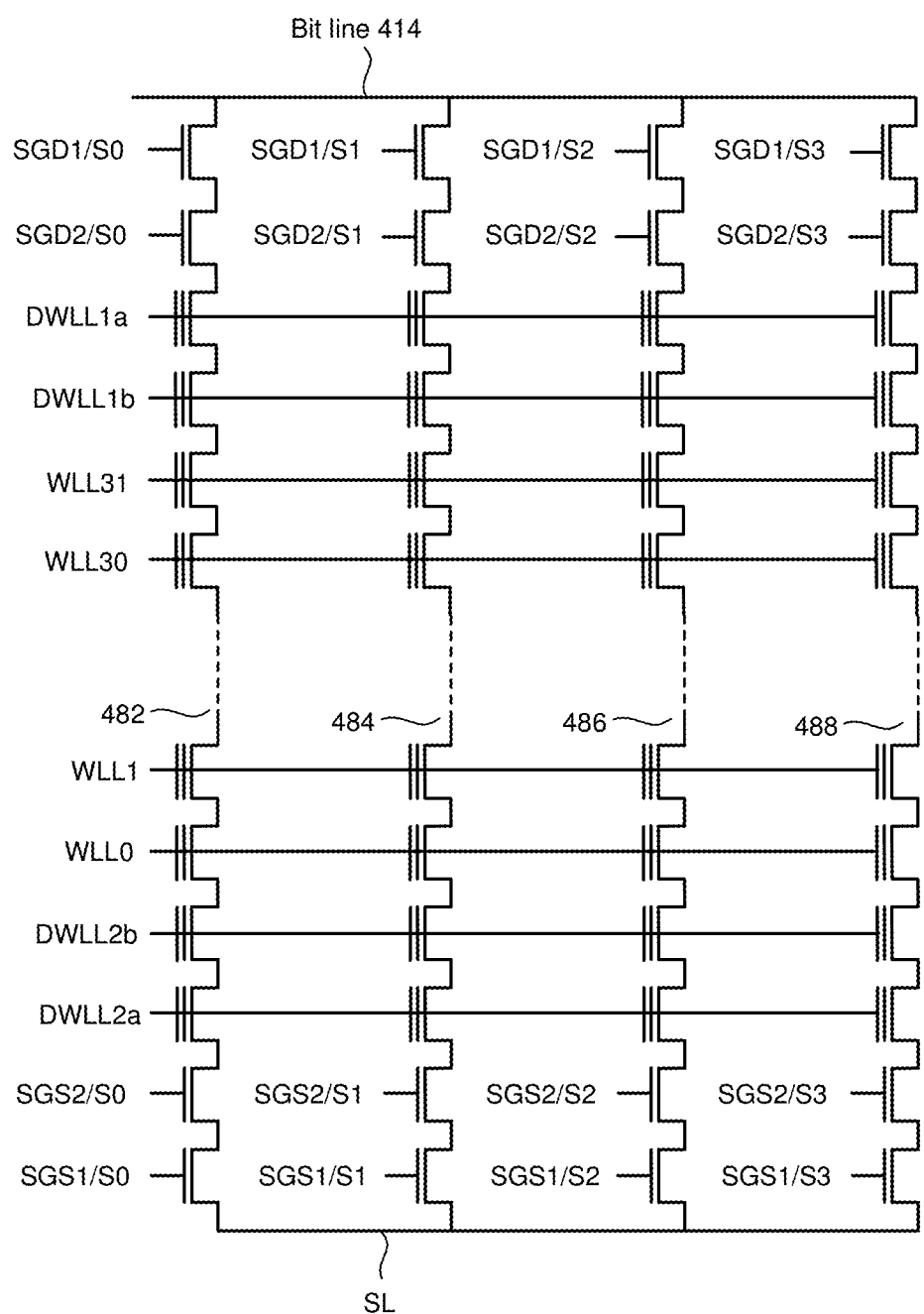
FIG. 4F is a schematic of a plurality of NAND strings.

FIG. 4F is a circuit diagram depicting a plurality of groups of connected programmable and erasable non-volatile memory cells arranged as four NAND strings connected to bit line 414 and common source line SL. The select lines SGD1/S0, SGD1/S1, SGD1/S2, SGD1/S3, SGD2/S0, SGD2/S1, SGD2/S2, SGD2/S3, SGS1/S0, SGS1/S1, SGS1/S2, SGS1/S3, SGS2/S0, SGS2/S1, SGS2/S2, and SGS2/S3 are used to select/unselect the depicted NAND strings. In one embodiment, there are two select lines (and, therefore, two select gates) on each side of each NAND string. Other embodiments can use more than two select lines (and two select gates) on each side or less than two select lines (and two select gates) on each side of the NAND strings. In the embodiment depicted in FIG. 4F, to connect a NAND string to the bit line both select gates must be actuated (via the two respective select lines) and to connect a NAND string to the common source line SL both select gates must be actuated (via the two respective select lines).

FIG. 5 is a schematic diagram depicting a sense amplifier circuit. Each sense block SB1, SB2, . . . , SBp (see FIG. 2) would include multiple sense amplifier circuits (e.g., sense circuitry 470). As described below, the circuit of FIG. 5 will pre-charge a capacitor (or other charge storage device) to a pre-charge magnitude, discharge the capacitor through the memory cell for a strobe time, and sense voltage at the capacitor after the strobe time. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described herein. FIG. 5 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line and disconnect capacitor 516 from Bit Line so that capacitor 516 is in selective communication with Bit Line. In other words, transistor 506 regulates the strobe time. That is, while transistor 506 is turned on capacitor 516 can discharge through the Bit Line, and when transistor 506 is turned off capacitor 516 cannot discharge through the Bit Line.

The node at which transistor 506 connects to capacitor 516 is also connected to transistor 510 and transistor 514. Transistor 510 is connected to transistors 508, 512 and 518.

Transistor 518 is also connected to transistor 520. Transistors 518 and 520 are PMOS transistors while the other transistors of FIG. 5 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

The circuit of FIG. 5 includes inverters 530 and 532 forming a latch circuit. The output of inverter 532 is connected to the input of inverter 530 and the output of inverter 530 is connected to the input of inverter 532 as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 514 is on (conducting). Since transistor 514 is on during the strobe time, then transistor 512 should be off. If the capacitor does not discharge during the strobe time, then the voltage at the SEN node will remain above the threshold voltage of transistor 514 and the charge at the inverters 530, 532 can be discharged into the CLK signal when STRO turns on transistor 512. If the capacitor discharges sufficiently during the strobe time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 6 is a timing diagram describing the behavior of various signals from FIG. 5. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510.

At t0, the voltage of H00 is raised from ground to a pre-charge level. The raising of the voltage at H00 turns on transistor 510 and opens up the pre-charge path. The magnitude of the voltage at H00 is set. FIG. 6 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, known as the strobe time, capacitor 516 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 6 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the strobe time and can be adjusted, as described above.

FIG. 6 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 7 is a flow chart describing a sensing operation performed according to the timing diagram of FIG. 6. In step 702, the appropriate verify reference voltage (e.g., Vv, Vv1, Vv2, Vv3, Vv4, Vv5, Vv6, or Vv7—see FIG. 8) is applied is applied to the selected word line. The selected word line is connected to the memory cells being programmed and verified. The bit lines connected to the memory cells being programmed and verified are charged to a predetermined pre-charge level. In step 704, all of the SEN nodes are pre-charged. In step 706, the bit lines are allowed to discharge, for example, by discharging the capacitor 516 (see t5-t6 of FIG. 6). After a predetermined time period, referred to as the "strobe time" or "integration time" the voltage of the capacitor 516 (or the SEN node) is sampled as described above to see whether the respective memory cell(s) conducted in step 708. As described above, the verification process is performed simultaneously for thousands of memory cells connected to the same word line and different bit lines.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores four bits of data. Other embodiments, however, may use other data capacities per memory cell (e.g., such as one, two, three, or five bits of data per memory cell). FIG. 8 shows sixteen threshold voltage distributions, corresponding to sixteen data states. The first threshold voltage distribution (data state) S0 represents memory cells that are erased. The other fifteen threshold voltage distributions (data states) S1-S15 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. Note that state N−1 is an adjacent lower data state for state N; for example, state 7 is an adjacent lower data state for state 8.

FIG. 8 also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (i.e., S0, S1, S2, S3, . . . ) the memory cell is in.

FIG. 8 also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15. For example, while some memory cells are being programmed from data state S0 to data state S1, other memory cells are being programmed from data state S0 to data state S2 and/or from data state S0 to data state S3, and so on. The arrows of FIG. 8 represent the full sequence programming. The technology described herein can also be used with other types of programming in addition to full sequence programming (including, but not limited to, multiple stage/phase programming).

FIG. 9 illustrates that another embodiment of threshold voltage distributions corresponding to data states S0-S15 that can partially overlap since the error correction can handle a certain percentage of memory cells that are in error.

Because of the size of the drawing, the references to the data states have been truncated such that 0 is used rather than S0, 1 is used rather than S1, 2 is used rather than S2, and so on.

Figure 10:
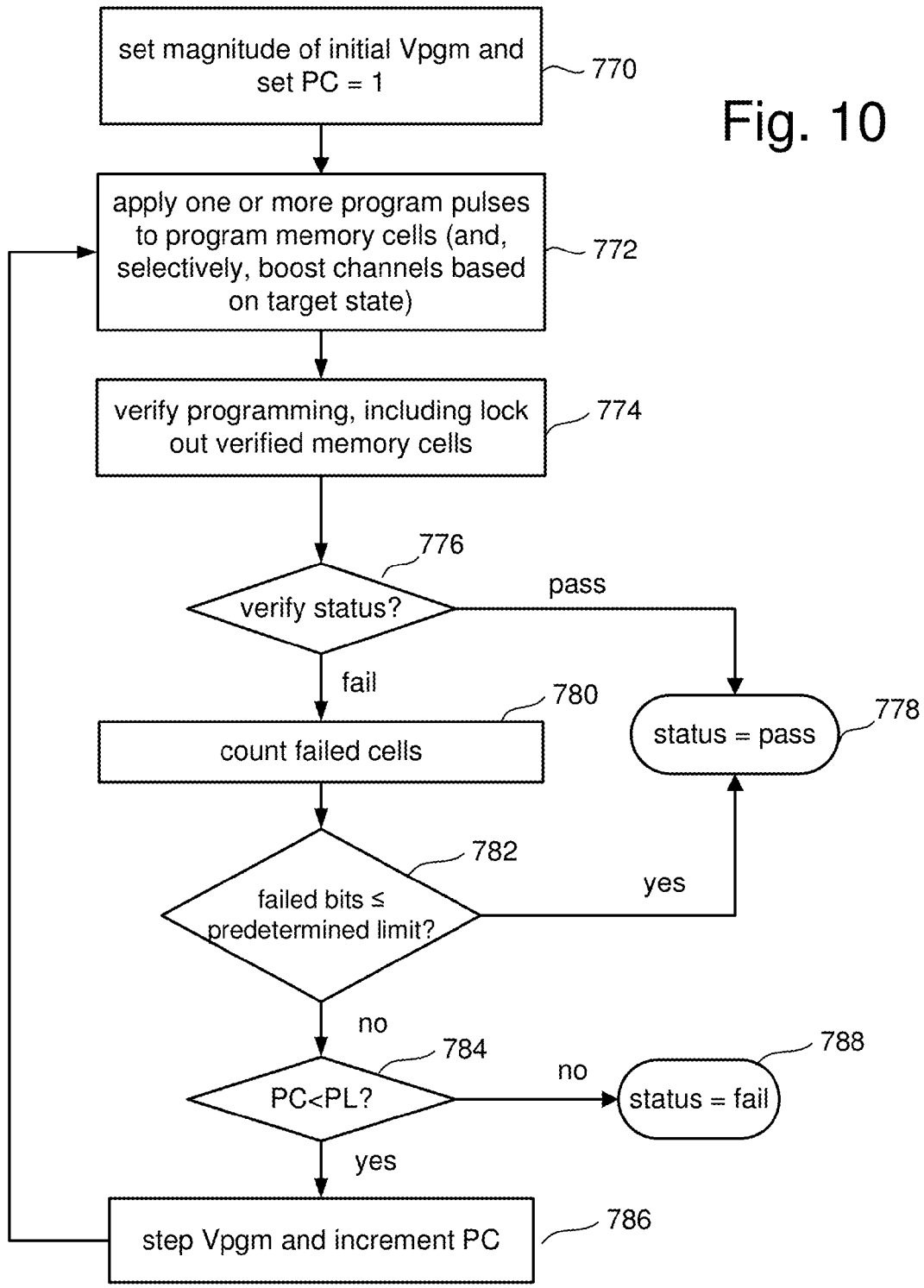
FIG. 10 is a flow chart describing one embodiment of a process for programming.

FIG. 10 is a flow chart describing one embodiment of a process for performing programming on memory cells connected to a common word line to one or more targets (e.g., also known as data states, programmed states or threshold voltage ranges). The process of FIG. 10 can be performed one or multiple times to program data to a set of memory cells. For example, the process of FIG. 10 can be used to program memory cells from S0 to any of programmed states S1-S15 in the full sequence programming of FIG. 8. The process of FIG. 10 can be used to program memory cells for any of the phases of a multi-phase programming process known in the art.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 770 of FIG. 10, the programming voltage (Vpgm) is initialized to the starting magnitude (e.g., ~12-16V or another suitable level) and a program counter PC maintained by state machine 112 is initialized at 1. In step 772, one or more program (voltage) pulses of the program signal Vpgm is applied to the selected word line (the word line selected for programming), so that it is applied to multiple NAND strings. In one embodiment, the group of memory cells being programmed concurrently are all connected to the same word line (the selected word line). The unselected word lines receive one or more boosting voltages (e.g., ~7-11 volts) to perform boosting schemes known in the art. In step 772, the program pulse is concurrently applied to all memory cells connected to the selected word line so that the memory cells connected to the selected word line that are not inhibited are programmed concurrently. That is, they are programmed at the same time or during overlapping times (both of which are considered concurrent). In this manner, all of the memory cells connected to the selected word line that are not inhibited will concurrently have their threshold voltage change. Additionally, step 772 includes selectively boosting the channels of the memory cells based on their respective target state separately and at appropriate time(s), as described in more detail below.

In step 774, the appropriate memory cells are verified using the appropriate set of target levels to perform one or more verify operations. In one embodiment, the verification process is performed by testing whether the threshold voltages of the memory cells selected for programming have reached the appropriate verify reference voltage (Vv1, Vv2, Vv3, . . . , Vv15) Memory cells that are successfully verified to have reached their target state are locked out from further programming.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line. In one embodiment, the process of FIG. 10 is performed by decoders 114/124/132, code and parameter storage 113, power control module 116, sense blocks SB1, SB2, . . . , SBp, read/write circuits 128 at the direction of state machine 112 (and/or controller 122).

When storing four bits of data in each memory cell using sixteen data states, as depicted in FIGS. 8 and 9, the process of verification (see step 774 of FIG. 10) can slow down the programming process. For example, some systems will perform a verification operation for each of the fifteen possible programmed states S1-S15. Thus, each iteration (loop) of the process of FIG. 10 can include fifteen verify operations (e.g. fifteen verify pulses on the selected word line) during step 774. The large number of verify operations slows down the programming Therefore, some systems will only verify for a subset of programmed states that the memory cells could potentially be achieving. In some embodiments, the number of programmed states being verified at a given time depends on the width of the natural threshold distribution. Therefore, it is proposed to reduce the amount of time needed to verify by reducing the width of the threshold voltage distribution so that less data states need to be verified at a given time. Here, natural threshold distribution refers to the threshold distribution that is obtained if a program pulse is applied to the word line without any program-verify operation. It depicts the threshold voltages at which the cells program to 'naturally'.

Figure 11:
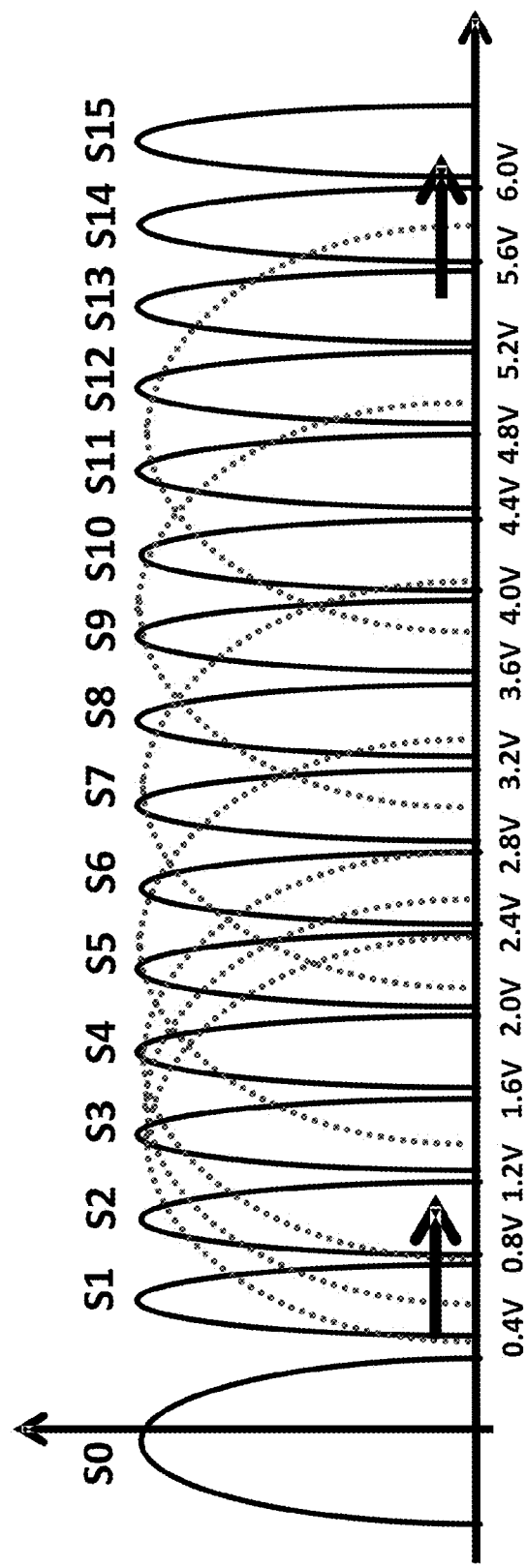
FIGS. 11 and 12 illustrate multi-state programming (different states programming concurrently) where the program-enabled cells for all target states have their channels similarly biased.
Figures 12, 13:
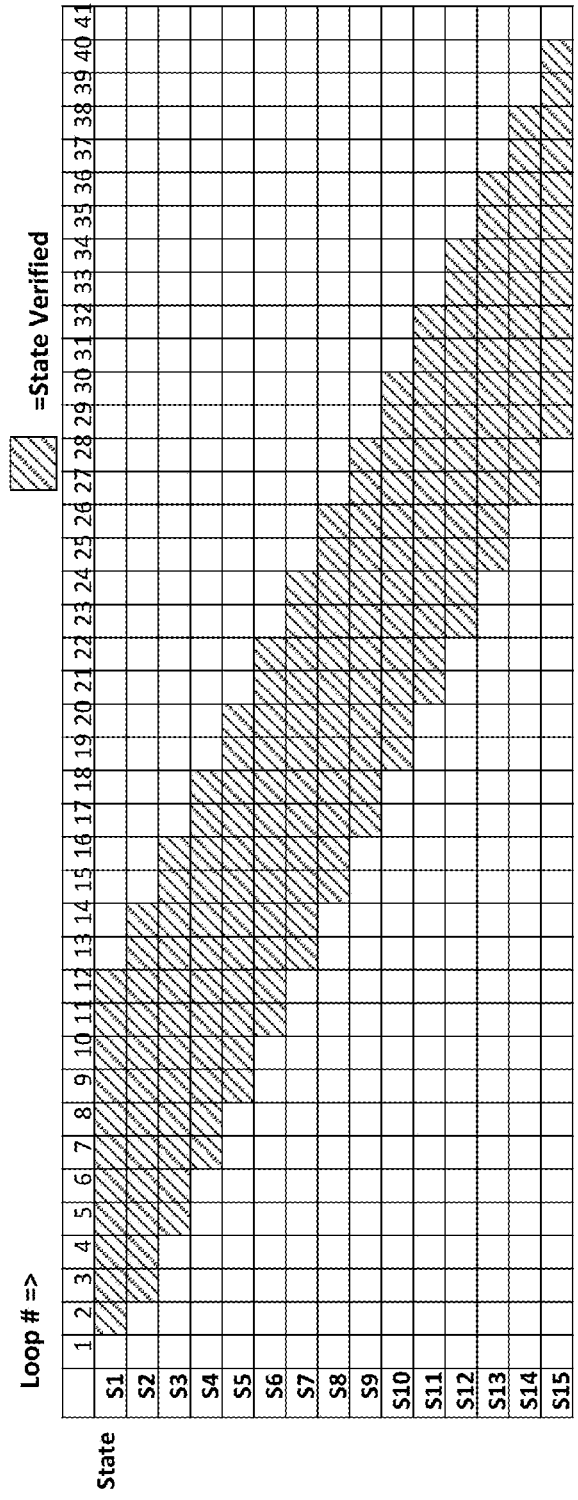
FIG. 13 gives some examples of channel boosting values and their correspondence to different target states

FIGS. 11 and 12 illustrate a typical programming operation where the program-enabled cells for all target states have their channels similarly biased. (The example is again for the memory cell array when each memory cell stores four bits of data, as in FIG. 8). As shown in FIG. 11, as the programming waveform is applied along a selected word line: for the program-enables cell the natural threshold voltage Vt moves through each state one by one as the programming loop increase, with each cell locking out as it verifies. Consequently, as described above with respect to FIG. 10, starting from the erased state S0, the Vt of the cells increase and are programmed into the programmed states distributions S1-S15. As non-defective cells will program at roughly the same rate, this means that the higher target states will require more programming loops than the lower target states, a situation illustrated in FIG. 12.

FIG. 12 plots the target states against the program loop number. The shaded squares correspond to the states verified after the program pulse of each loop, where a "smart verify" arrangement is used which checks only those states likely to still be programming for non-defective cells. As shown, all cells programming to the S1 state are likely to verify within a dozen loops, while the S15 states may take as many as 40. Based on a typical cell population and programming parameters, using ~38 Vpgm pulses and ~150 verify operations (10 per state for 15 states) results in a relatively long program operation. To reduce the number of pulses and verifies, the following discussion presents techniques to selectively raise the channel based on a cell's target state.

More specifically, in a multi-state program (MSP) scheme, the channels associated with memory cells are raised up to a potential (Vch) that is a function of the cell's target programming state. Depending on the embodiment, this can be done for all states, or a subset. Lower states get a higher channel potential, while higher states get a lower channel potential. As the same Vpgm pulse is applied to all of the cells on the word line, the lower-states effectively feel a lower VPGM which slows down its programming Thus, in effect, multiple states can be programmed simultaneously are roughly the same rate.

The table of FIG. 13 gives some examples of channel boosting (Vch) values and their correspondence to different target states, where *S0 refers to cells belonging to the erased state as well as any locked-out cells from other target states. The bottom row shows the resultant effective Vpgm value for actual Vpgm value of 20V being applied to the selected word line. As shown, a cell targeted for the highest S15 target state sees the full Vpgm value, while the effective Vpgm for the other states is reduced, resulting in relatively less programming per pulse. This allows for cells being programmed to different target states to program at about the same rate, so that for the same Vpgm pulse, each state has its own natural Vt, and as the program loop count increase, all states complete programming more or less simultaneously.

Figure 14:
FIG. 14 is a table of target state versus the program loop number when incorporating channel boosting based on the target state.

The table of FIG. 14 again plots the target states against the program loop number, as with FIG. 11, but now incorporating channel boosting based on target states for all of the states. Relative to FIG. 11, programming will need only ~10 program pulse, as compared to 38 in the conventional program case, thus improving program performance. As all states are here verified in each loop, the number of verifies remain unchanged. However, since all the state verifies are now done at each verify iteration, the total number of verify-iterations is reduced. At each verify iteration, there is some amount of overhead to pre-charge and discharge the various signals involved in each verify. Thus, by reducing total number of verify iterations, multi-state programming also reduces the total time spent in verify operations resulting, in faster program performance.

Figure 15:
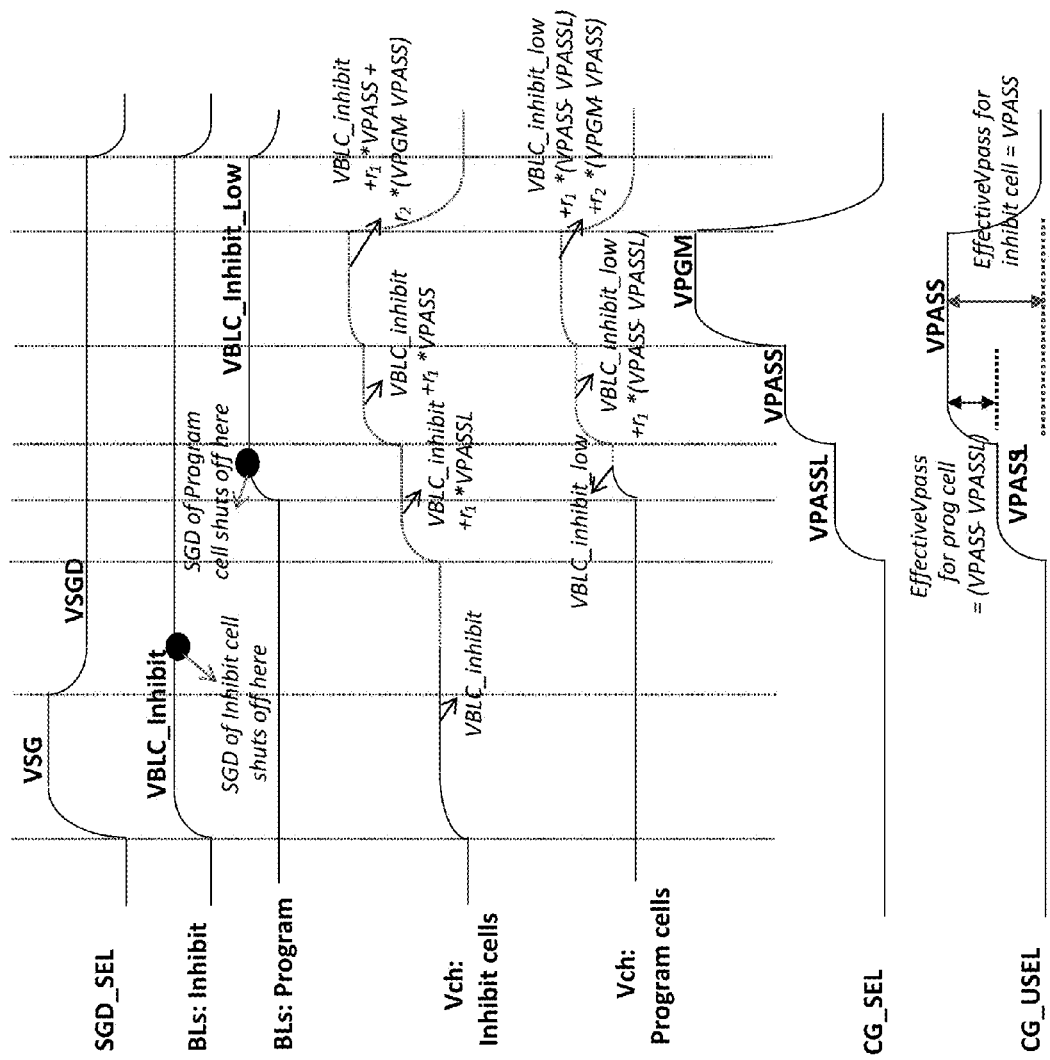
FIG. 15 is a set of waveforms illustrating some details of biasing a NAND memory array to raise the channel potential in the example of a single state.
Figure 16:
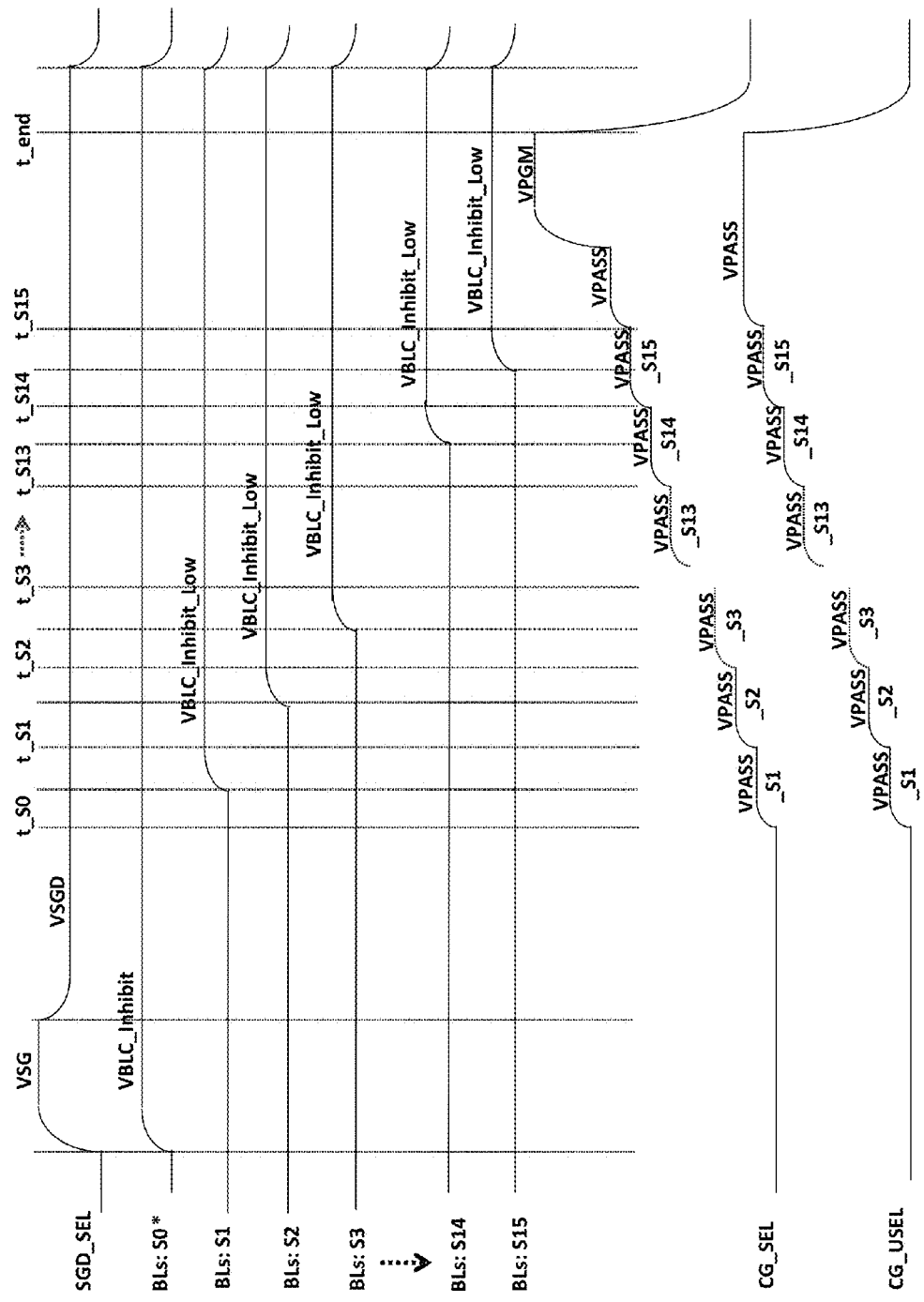
FIG. 16 is a set of waveforms illustrating details for biasing a NAND memory array to raise channel potentials separately for each state of programming memory cells.

FIGS. 15 and 16 are a set of waveforms illustrating some details of exemplary embodiments for biasing a NAND memory array to raise channel potentials of programming memory cells in a controller manner, where FIG. 16 sets the channel separately for each state and where FIG. 15 looks at just a single state. Looking at FIG. 15, the conventional approach of modulating the channel potential (Vch) for programming memory cells is to directly drive their BL-voltages to the desired level. This is shown in the left portion of FIG. 15, where (along with raising the drain select gates SGD_SEL to VSG and then dropping to VSCD) non-selected bit lines are raised to the inhibit level VBLC_Inhibit and bit lines selected from programming are held at the program enable level of ground. This allows the selected cells to see the full Vpgm, while the drain side select gates will shut off when SGD_SEL drops to VSG, leaving the channel of the non-selected cells to float. Ignoring for the moment the central part of the figure, the convention process would then continue with the non-selected word lines going to Vpass, and then with the selected word line going to Vpgm, as shown to the right of FIG. 15. This results in all selected cells having the same Vch, namely 0V.

To do multi-state programming with the sort of target state dependent channel voltages illustrated in FIG. 13 by applying the higher voltages directly to the bit lines, the biasing circuitry would need to apply something like ~5.6V of bit line voltage for cells with an S1-state target state. In order to a maintain sufficient Vsgd window, this would need the VBLC_Inhibit to go up to something like ~7V. This is typically not a practical voltage to be delivered to a bit line from a sense amp, as such high voltages could cause break down in the sense amp transistors. Also, using sense amps to set such values would consume a significant amount of power/time to charge-up bit lines to such high levels.

To avoid these problems while still raising the word lines to the desired level, the exemplary embodiments presented here use the self-boosting property of the memory cell to raise the channel potential. The Vpass ramp is changed to a multi-step ramp. The BL-associated with the programming cell is kept at ground until the Vpass level reaches the first step (=VPASSL), after which it is raised up to a level of VBLC_Inhibit_Low to shut-off the SGD. This leaves the channel to float. Here the value of VBLC_inhibit_low is intermediate to ground and VBLC_inhibit, being chosen high enough to turn off the corresponding select gate, but somewhat lower than VBLC_inhibit to improve power consumption and require less time to charge up. In other embodiments, VBLC_inhibit can be used rather than the intermediate VBLC_inhibit_low to simplify the number of levels supplied from the sense amps. After this, Vpass ramps up to final level (=VPASS), which raises the Vch up by an amount proportional to (VPASS−VPASSL), as illustrated in FIG. 16 (where r1 and r2 are the corresponding coupling ratios). By controlling the VPASSL level, the memory can control the Vch of the programming memory cells. Specifically, a lower VPASSL will result in higher Vch for the programming memory cells. This concept can be extended to multi-states by having a multi-step VPASS ramp. (In this example, typical values are: VBLC_inhibit ~2.2V, VBLC_inhibit_low~1.5V, VSG~4V, VSGD~2.5V, VPGM~20V, VPASSL~7V, VPASS~10V, $r_1$~0.9, $r_2$~0.02.)

FIG. 16 looks at the multi-state programming using controlled weak boosting in a four-bit per cell embodiment. FIG. 16 is similar to FIG. 15, now between times t_S0 and t_S15 (indicated at top) the word lines ramp up from ground to VPASS through a series of steps, one for each target state, rather the single intermediate state (VPASSL) of FIG. 15. As illustrate by the waveforms in the middle of FIG. 16, each selected bit line is then raised from ground to the level shutting off the select gate (VBLC_Inhibit_Low) at a target state dependent level of the word line ramp: For instance, for target state S3, the bit lines are raised at the corresponding step VPASS_S3 between time t_S2 and t_S3. Depending on the embodiment, a number of variations are possible. For example, FIG. 16 is a "full" embodiment in that the bit lines are raise for each target state during the word line ramp and in that each state has its own step: more generally, a smaller number of steps can be used, where several target states share a step, not all target states use the weak boosting, or both. Also, although the exemplary embodiments use a stepped ramp from ground to VPASS, other waveforms, such as a constant ramp, can be used, although these may make the timing for raising bit lines more exacting.

Figure 17:
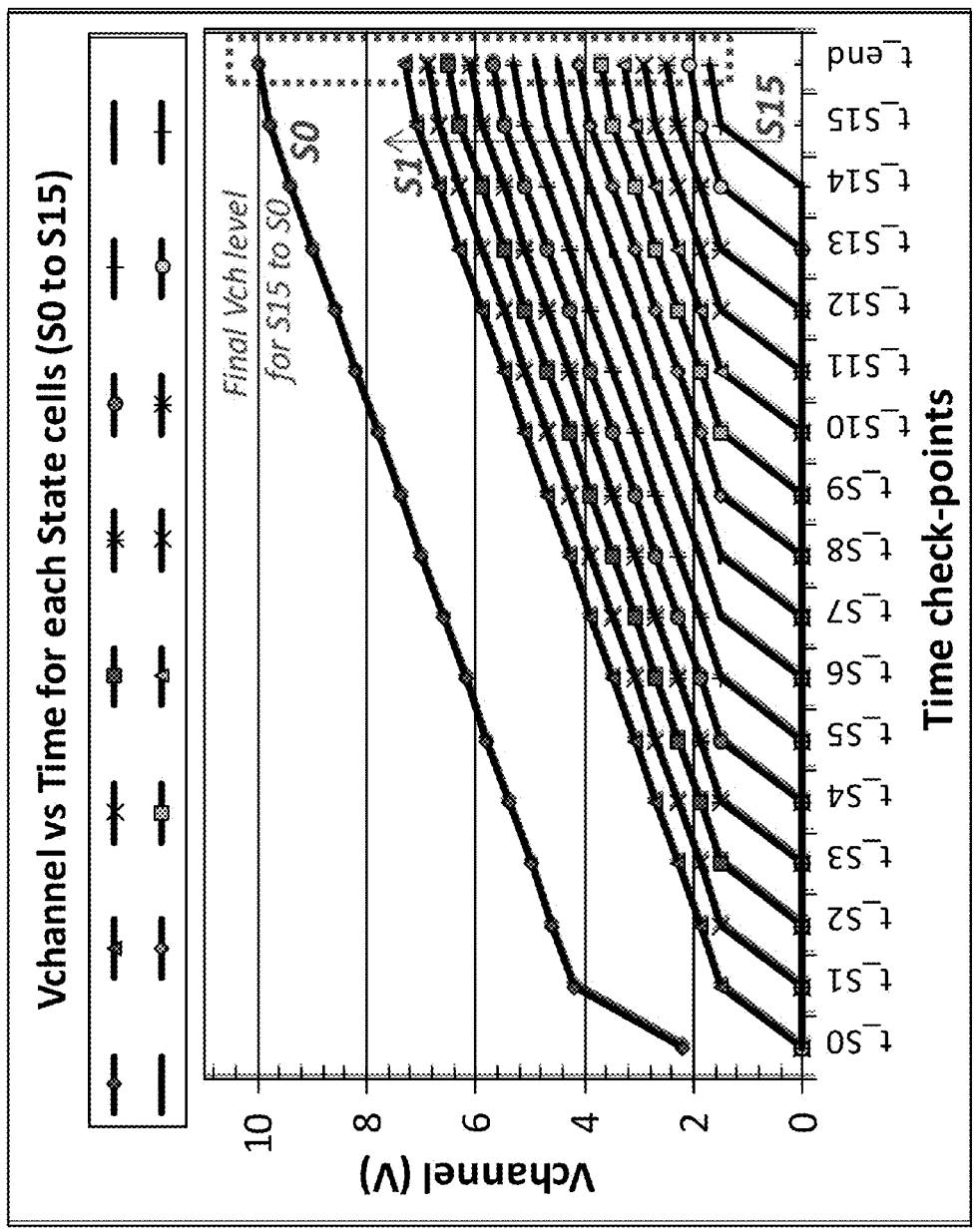
FIG. 17 shows how the channel voltages of the different target state cells change over-time for the arrangement of FIG. 16.

FIG. 17 shows how the channel voltages of the different target state cells change over-time for the arrangement of FIG. 16. Times on the x-axis correspond the times along the top of FIG. 16. The final channel potential for any given state comes from VBLC (pre_charge)+Boosting. The boosting amount is proportional to the Vpass swing after select gate cuts off for the respective channel, with the subsequent boosting provided as the word line voltages subsequently continue to ramp up to VPASS. In the exemplary embodiment, all of the word lines of the block ramp up. In other embodiments, less than all of the word lines could ramp up, but at least one of the word lines adjacent to the selected word line ramps up in order to pull up the channel By varying the ramp of VPASS waveform, the channel voltage for each target state can be modulated. By using this approach, a desired potential difference of, for example, ~0.4V from one state to another can be obtained. (In the example of FIGS. 15 and 16, typical values can be something like: VBLC_inhibit=2.2V, VBLC_inhibit_low=1.5V, VPASS_S1=2.2V, (VPASS_Sn+1−VPASS_Sn)=0.45V, VPASS=10V, VPGM=20V, $r_1$~0.9, $r_2$~0.02.)

Figure 18:
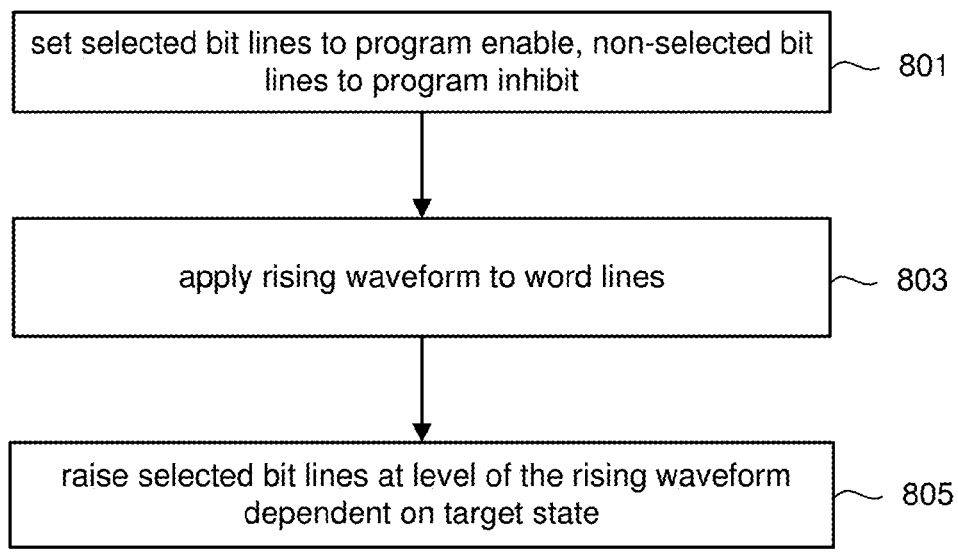
FIG. 18 is a flow illustrating aspects of the exemplary embodiments for biasing the array prior to applying of the programming pulse.

FIG. 18 is a flow illustrating aspects of the exemplary embodiments for biasing the array prior to applying of the programming pulse. Referring back to FIG. 10, step 772 included selectively boosting the channels of the memory cells based on their respective target state. At step 801, the bit line biasing circuit sets bit lines corresponding to selected memory cells along the first word line to ground, or, more generally, the low supply level to enable programming; and bit lines corresponding to non-selected memory cells along the first word line to a program inhibit level. At step 803, the word line drivers or biasing circuit subsequently applies a rising waveform to the selected word line and one or more additional word lines, including a word line adjacent to the first word line. The word lines ramp from ground to the VPASS level. While the bit lines are rising, at step 805 the bit line drivers or biasing circuit raises the bit lines corresponding to selected memory cells from the low supply level at a level of the rising waveform dependent on the selected memory cell's target state, where the bit line is raised to a voltage sufficient to turn off the corresponding select gate.

The techniques described above can have number of variations or alternatives. For example, referring back to FIG. 16, this shows all bit lines belonging to programmed states going to VBLC_inhibit_low at some point; however, in other cases an option is where some or all states stay at VBL=0V to reduce the boosting amount. Additionally, although the main discussion here is in the context of a four-bit per cell configuration, the techniques readily apply to other multi-state formats, such as 2 or 3 bits per cell, where the number of Vpass-stairs will be lowered accordingly.

Figure 19:
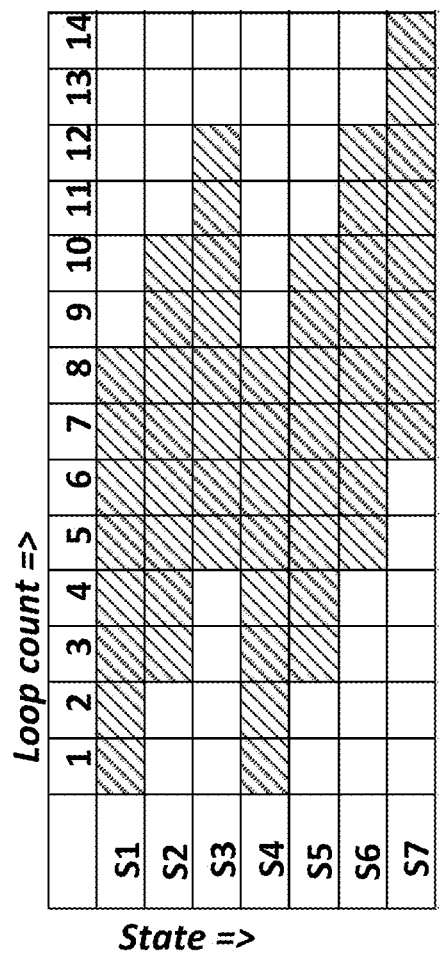
FIG. 19 illustrates an alternate embodiment where a set of lower target states are weakly boosted as a group.

As noted above, another variation is where a sub-set of the target states receive a common amount of weak boosting. FIG. 19 is similar to FIG. 14, but looks at a 3 bit per cell embodiment in the case where only the three lowest, non-erased target states are weakly boosted by the same amount. More specifically, the target states S1-S3 receive the same amount of weak boosting, while target states S4-S7 receive no channel boosting. This can allow the use of a programming staircase waveform that starts at a higher level so that the faster cells being programmed to both the S1 and S4 target states can begin to verify after the first pulses. Under a typical programming algorithm without the weak boosting, the S4 states would not begin to verify until, say, around the 7th pulse and the lower ones of the S7 states might take around 20 pulses.

Figure 20:
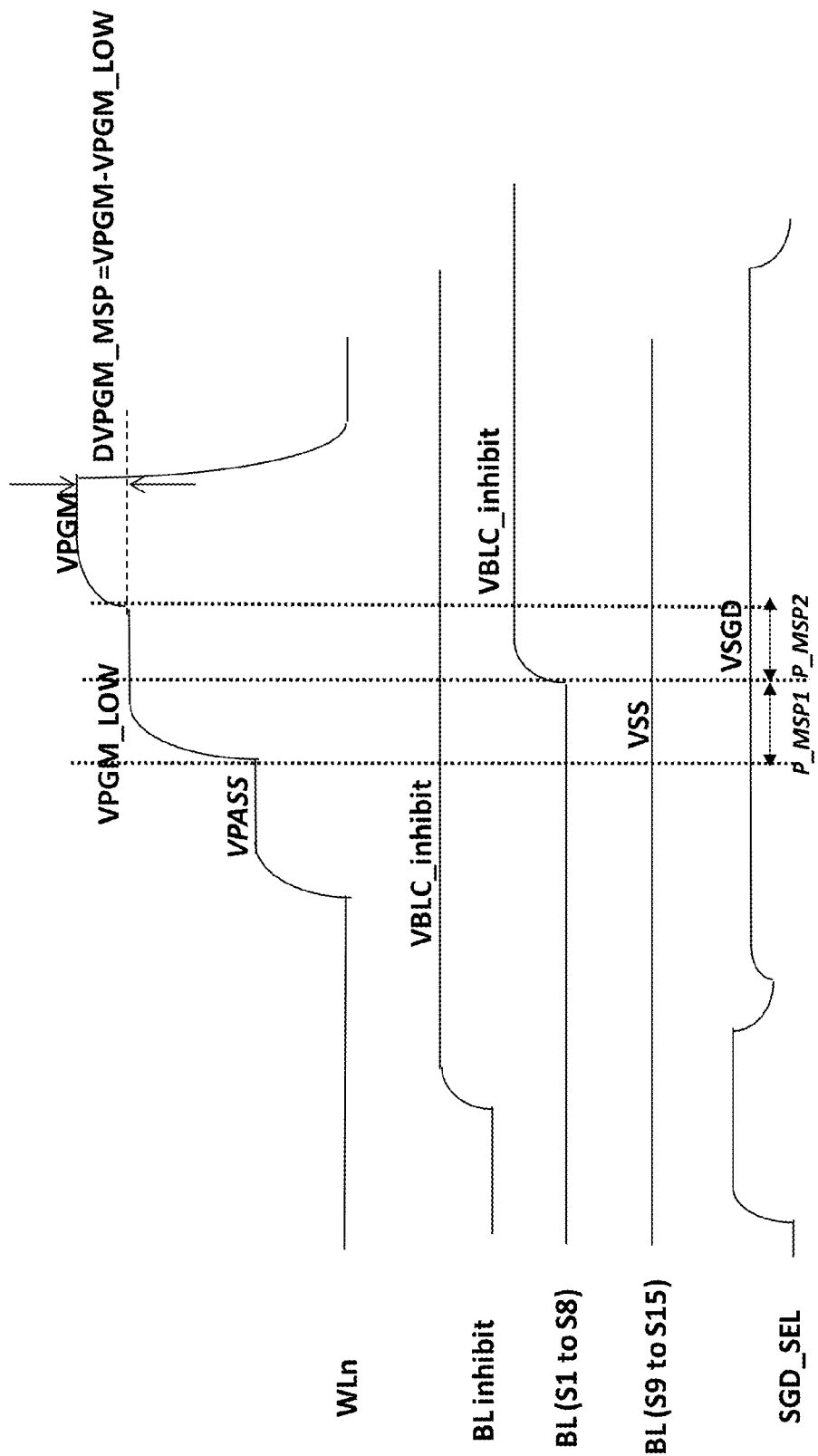
FIG. 20 illustrates use of a programming waveform in weak boosting.

FIG. 20 presents an alternate embodiment where the non-selected word lines use a standard biasing waveform, but where the selected word line uses a modified programming waveform. The example of FIG. 20 uses a 4 bit per embodiment where a lower set of states (S1-S8) use weak boosting and the high states (S9-S15) do not. As shown in FIG. 20, the bit lines corresponding to inhibited cells (BL inhibit), the bit lines of higher target states (BL(S9 to S15)), and the drain side select gates (SGD_SEL) are all biased with normal waveforms. Although not shown, unselected word lines and other select gate also are biased according to normal waveforms. The waveform to the selected word line (WLn) and the bit lines corresponding to lower target states (BL(S1 to S8)) are modified to introduce weak boosting for the lower target states.

In a typical programming operation, WLn would first go to VPASS along with the other word lines, after which the VPGM is applied. In FIG. 20, WLn instead goes from VPASS to an intermediate level VPGM_LOW, and then on to VPGM. While WLn is at this intermediate level of VPGM_LOW, weak boosting is applied to the lower target states by raising the BL(S1 to S8) waveform from the program enable level to a level sufficient to shut of the correspond drain side select gate, leaving the channel to float. In this example, VBLC_inhibit is used, but, as discussed above with respect to FIGS. 15 and 16, a lower value such as VBLC_inhibit_low can be used. The difference between VPGM and VPGM_LOW used for multistate programming is labelled DVPGM_MSP, where the amount of this voltage swing is selected to provide the desired amount of weak boosting to the channel voltage Vch for the S1-S8 target states to slow their programming.

In FIG. 20, P_MSP1 corresponds to the time to ramp WLn to the initial VPGM_LOW level. P_MSP2 is the time to ramp BL(S1 to S8) from 0V to VBLC_inhibit, after which WLn is take to the full VPGM level. If a greater number of distinct levels of boosting for different target states is wanted, additional intermediate steps can be introduced into the WLn waveform, with the bit lines raised at a step corresponding to the desired target state.

Figure 21:
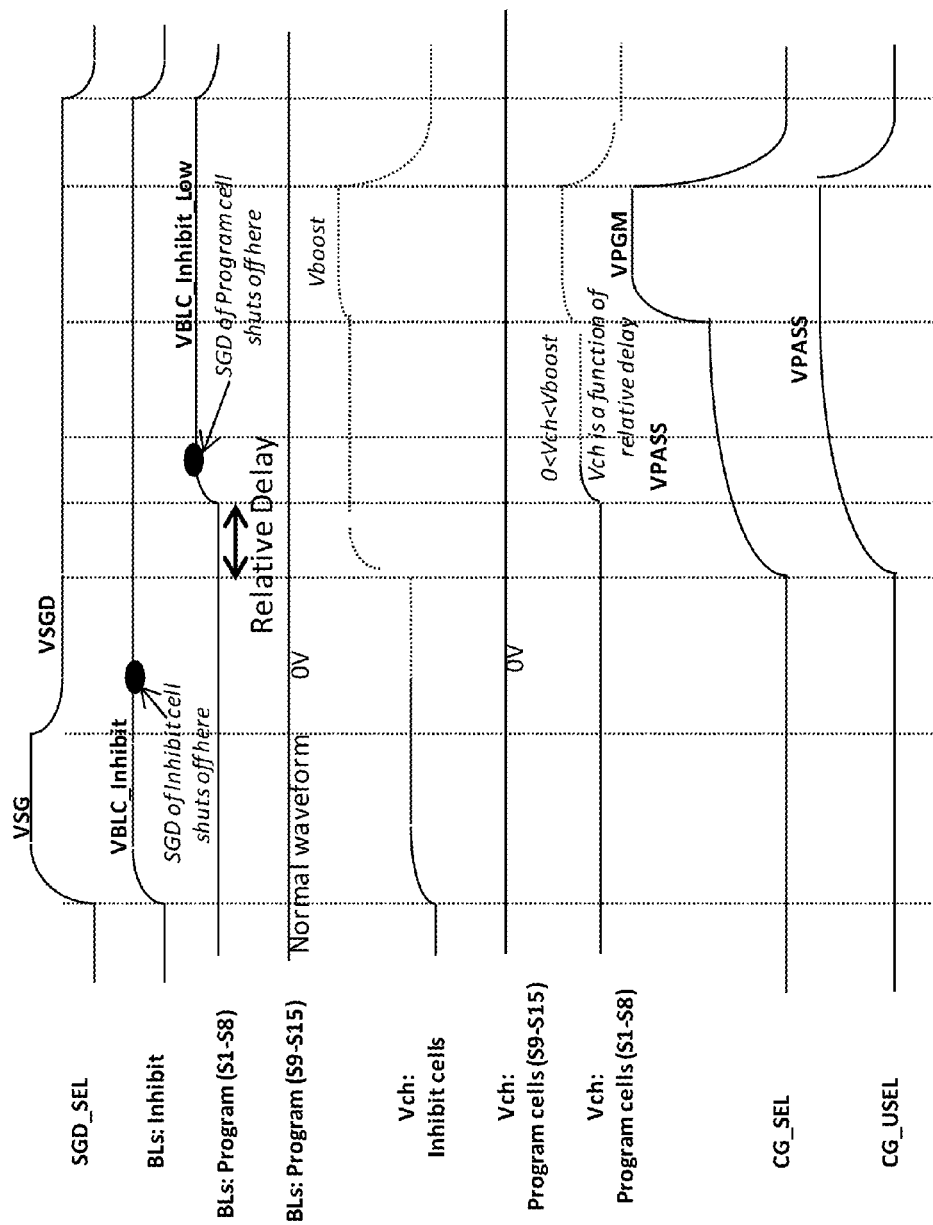
FIG. 21 illustrate use of a ramping waveform on word lines and a delayed raising of the bit lines corresponding to cells using weak boosting.

FIG. 21 describes another set of embodiments, again for the example of 4 bits per cell, and where target states S1-S8 receive weak boosting but the S9-S15 target states do not. Rather than raising the level on the word lines in a set of steps as in FIGS. 15, 16, and 20, with the bit lines used for weak boosting raised at a step based on their target state, the word lines are instead ramped up to the VPASS level without the steps. In this example, the word lines for both the inhibited and programming cells receive the same VPASS level, with the word lines ramping from ground to VPASS. For cells to be inhibited, the bit lines are set at VBLC_inhibit prior to the raising the word lines. For cells being programmed without weak boosting, the bit lines stay at the program enable level of 0V. For the cells to be programmed with weak boosting, the bit lines are raised to VBLC_inhibit_low, but with a delay relative to the start of the VPASS ramping on the word lines. The resulting amount of channel boosting for the three cases is shown in the middle three traces of FIG. 21. Since there is a delay in raising bit line up to VBLC_inhibit_low for the cells to receive weak boosting, the channel potential (Vch: Program cells (S1-S8)) is smaller than regular Vboost of the inhibited cells. By controlling the delay timing, the channel potential can be varied. This arrangement can be extended to different levels of weak boosting by using different amount of delay, similar to as shown in FIG. 16, but with a non-stepped rising waveform for VPASS.

Since this method relies on boosting, the amount of slowing of program amount may be a function of the word line; that is, it may be a function of the location of the word line within the NAND strings. Thus, it may be useful to incorporate word line-dependent values for the Vpass-stair case bias levels. Also, the boosting amount can sometimes be a function of the cell's Vt. In that case, it may be useful to incorporate a program loop-count dependent Vpass-stair case bias levels. For the same reason, the delta between each stair case level may not be the equal across all of the target states.

The sort of boosting techniques presented here can also be extended to incorporate programming variations such "quick pass write" or "natural Vt compaction". In the quick pass write technique, cells being programmed are verified at a lower level as well as the usual verification level for their target state and, when a cell verifies at the lower level, it programming is slowed, such as by partially inhibiting the cell. In the sort of VPASS ramping arrangement presented above, this can be effected by raising the corresponding bit line on an earlier step.

With respect to natural threshold voltage compaction, the channel boosting concept for multi-state programming can be extended to include natural Vt compaction (NVC) to reduce the number of VPGM pulses and verifies. The natural Vt compaction concept can be illustrated with respect to FIGS. 22A-C, 23A and 23B.

Figure 22B:
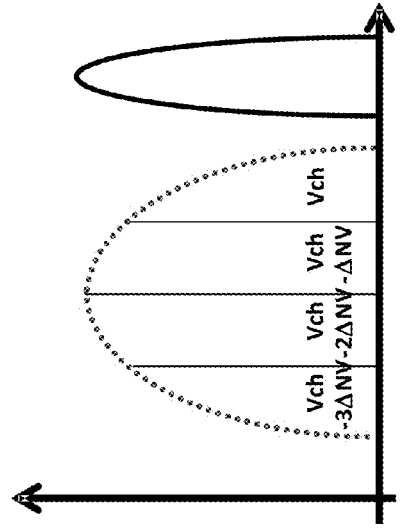
FIGS. 22A-C, 23A and 23B illustrate the concept of natural Vt compaction.
Figure 22A:
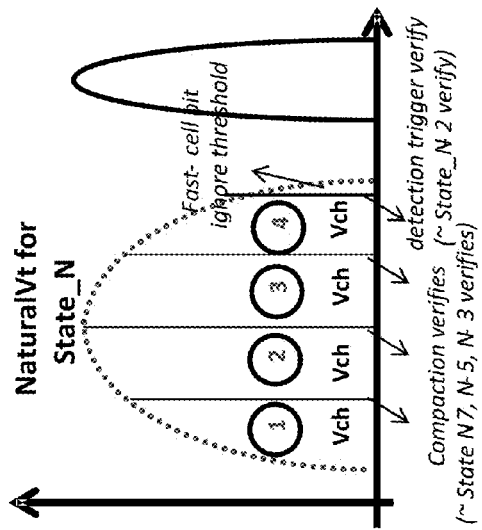

When programming cells to a state N, some cells will program more quickly than other, as illustrated in FIG. 22A, which shows the desired distribution at State_N and the wider distribution of the natural Vt distribution at some intermediate point in the programming operation. FIG. 22A shows the situation just before the upper tail of natural threshold distribution passes a trigger point (such as a lower verify level, say for the state N−2). Up until this point, all cells going to the state N have been programmed with the same channel level Vch applied on all State N cells. Once the fastest few cells pass the trigger point, an additional set of verifies are done (such as at N−3, N−5, and N−7 levels) to divide the natural Vt distribution into 4 (for this example) pieces to do Natural Vt compaction.

Figure 22C:
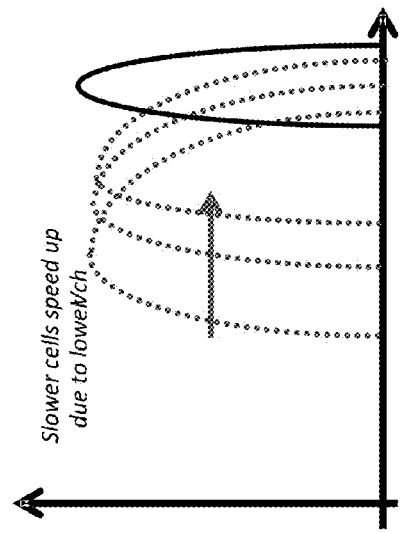

FIG. 22B is the situation just after detection trigger passes. The Vch on slower cells is lowered to speed up their programming. The lowering amount (=ΔNV) is a function of cell position within the natural Vt distribution. FIG. 22C represents the compaction effect during subsequent pulses due to the difference amount of channel boosting. The lower-tail of the natural Vt moves faster (due to lower Vch), which over a few pulses compacts the natural Vt distribution. These Vch biases can remain the same until the program finishes.

Figure 23B:
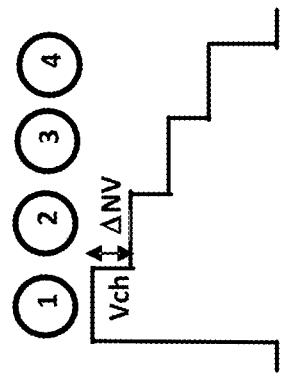
Figure 23A:
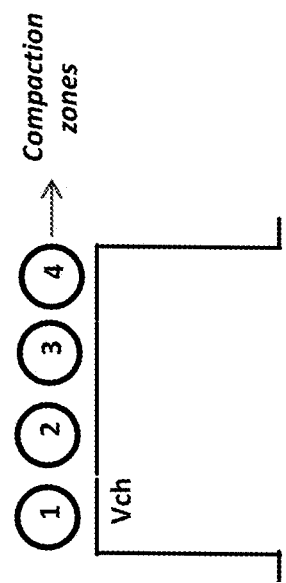

FIGS. 23A and 23B are a schematic representation of the natural Vt compaction method using Vch modulation depending on cell position in natural Vt distribution for any given state. In this example, the natural Vt distribution is divided into 4 pieces, and the Vch is reduced on the slower-cells (proportional to the amount by which the cell is slower), which will speed up those cells program and thus compact the natural Vt distribution. Here, State_N is shown as an example, however in case of multi-state programming, this is can happening in parallel for multiple or all states simultaneously. This can be done, for example, by introducing sub-steps for different compaction regions of a given state, raising the bit line to VBLC_inhibit_low for slower cells at a later state's VPASS step, or a combination of these.

As described above, the multi-state programming techniques allow for multiple different target states to be programmed concurrently by modulating the program speed of each target state using a controlled amount of state-dependent weak boosting in their respective channels. The channel boosting is controlled by using a multi-stair WL ramp (VPASS ramp) in conjunction with raising of the voltage on the bit lines at a time based on the target state.

One embodiment includes an apparatus, where the apparatus includes one or more NAND strings having memory cells connected along word lines and in which the memory cells of each NAND string are connected through a corresponding select gate to a corresponding bit line. A control circuit is connected to the word lines and bit lines and is configured to concurrently program a plurality of memory cells connected to a first word line from an initial state to a corresponding one of multiple target states. A bit line biasing circuit is configured to bias bit lines corresponding to non-selected memory cells along the first word line to a program inhibit level and to bias bit lines corresponding selected memory cells along the first word line to a low supply level. A word line biasing circuit is configured to raise a voltage on a set of one or more word lines including the first word line from the low supply level to a first voltage level. While the word line biasing circuit is raising the voltage on the set of one or more word lines from the low supply level to the first voltage level, the bit line biasing circuit is configured to raise voltage on bit lines corresponding to selected memory cells from the low supply level to a second voltage level based on a level of the rising voltage on the set of one or more word lines that depends on the target state of the corresponding selected memory cell, where the second voltage level having a magnitude sufficient to turn off the corresponding select gate through which the selected memory cells are connected to the corresponding bit lines. A programming circuit is configured to subsequently send a program pulse to the first word line.

In one exemplary embodiment, selected memory cells along a first word line of a non-volatile memory array are programmed from an initial state to a corresponding one of multiple target states, where the non-volatile memory array is formed of a plurality of NAND strings in which the memory cells are connected along a plurality of word lines, including the first word line, and in which the memory cells of each NAND string are connected through a select gate to a corresponding bit line. The programming includes applying a sequence of one or more program pulses to the first word line of the biased memory array and, prior to each of the programming pulses, biasing the memory array. Biasing the memory array includes: setting bit lines corresponding selected memory cells along the first word line to a low supply level and setting bit lines corresponding to non-selected memory cells along the first word line to a program inhibit level; subsequently applying to a set of one or more word lines including the first word line a waveform rising from the low supply level to a first voltage level; and, for each bit lines corresponding to selected memory cells along the first word line, raising the bit line from the low supply level to a second voltage level at a level of the waveform based on the selected memory cell's target state, the second voltage level being sufficient to turn off the corresponding select gate.

Other exemplary embodiments present an apparatus of one or more NAND strings in which memory cells are connected along word lines and in which the memory cells of each NAND string are connected through a select gate to a corresponding bit line. Means are connected to the word lines and bit lines for concurrently programming a plurality of memory cells along a first word line from an initial state to one of multiple target states in which the programming includes biasing of the NAND strings and subsequently applying a program pulse to the first word line of the biased NAND strings. The biasing includes setting bit lines corresponding to non-selected memory cells along the first word line to a program inhibit level and setting bit lines corresponding selected memory cells along the first word line to a low supply level. The biasing also includes subsequently applying to a set of one or more word lines including the first word line a voltage that rises from the low supply level to a first voltage level. For bit lines corresponding to selected memory cells along the first word line, the biasing further includes raising the bit line from the low supply level to a voltage level having a magnitude sufficient to turn off the corresponding select gate at a level of the voltage applied to the set of one or more word lines that is based on the selected memory cell's target state.

In various embodiments, a means for concurrently programming a plurality of memory cells may include the read/write circuits 128, sense blocks 129, and other elements connected to bias the word lines, bit lines and other array elements during program and verify operations, including driver circuits, charge pumps, voltage regulators, or other circuitry. Other embodiments may include similar or equivalent means for concurrently programming a plurality of memory cells.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   one or more NAND strings having memory cells connected along word lines and in which the memory cells of each NAND string are connected through a corresponding select gate to a corresponding bit line; and
   a control circuit connected to the word lines and bit lines, the control circuit configured to concurrently program a plurality of memory cells connected to a first word line from an initial state to a corresponding one of a plurality of target states;
   a bit line biasing circuit configured to bias bit lines corresponding to non-selected memory cells along the first word line to a program inhibit level and to bias bit lines corresponding selected memory cells along the first word line to a low supply level;
   a word line biasing circuit configured to raise a voltage on a set of one or more word lines including the first word line from the low supply level to a first voltage level;
   wherein, while the word line biasing circuit is raising the voltage on the set of one or more word lines from the low supply level to the first voltage level, the bit line biasing circuit is configured to raise the voltage on the bit lines corresponding to selected memory cells from the low supply level to a second voltage level based on a level of the rising voltage on the set of one or more word lines dependent on the target state of the corresponding selected memory cell, the second voltage level having a magnitude sufficient to turn off the corresponding select gate through which the selected memory cells connect to the corresponding bit lines; and
   a programming circuit configured to subsequently send a program pulse to the first word line.

2. The apparatus of claim 1, wherein the set of one or more word lines includes the first word line and a word line adjacent to the first word lines.

3. The apparatus of claim 1, wherein the second voltage level is intermediate to the low supply level and the program inhibit level.

4. The apparatus of claim 1, wherein the word line biasing circuit raises the voltage on the first word line and one or more additional word lines from the low supply level to the first voltage level in a staircase waveform having a plurality of steps intermediate to the low supply level and the first voltage level; and wherein bit line biasing circuit raises the bit line corresponding to selected memory cells from the low supply level to the second voltage level at one of the steps dependent on the selected memory cell's target state.

5. The apparatus of claim 4, wherein the program pulse is one of series of program pulses and the programming further includes a program verify prior to biasing the bit lines, and wherein the non-selected memory cells along the first word lines includes one or more memory cells having verified as programmed to a corresponding target state.

6. The apparatus of claim 5, wherein the step at which the bit lines corresponding to a selected memory cells along the first word line is raised from the low supply level to the second voltage level is further dependent on a result of the verify.

7. The apparatus of claim 4, wherein the number of steps is the same as the number of target states.

8. The apparatus of claim 4, wherein the staircase waveform is dependent upon the location of the first word line within the NAND strings.

9. The apparatus of claim 4, wherein the program pulse is one of series of program pulses and the staircase waveform is dependent on the number of the program pulse within the series.

10. The apparatus of claim 1, wherein NAND string are part of a memory array of a monolithic three-dimensional semiconductor memory device where the memory cells are arranged in multiple physical levels above a silicon substrate and comprise a charge storage medium.

11. A method, comprising:

programming a plurality of selected memory cells along a first word line of a non-volatile memory array from an initial state to a corresponding one of a plurality of target states, the non-volatile memory array being formed of a plurality of NAND strings in which the memory cells are connected along a plurality of word lines, including the first word line, and in which the memory cells of each NAND string are connected through a select gate to a corresponding bit line, the programming including:
applying a sequence of one or more program pulses to the first word line of the memory array; and
prior to each of the programming pulses, biasing the memory array, wherein the biasing the memory array includes:
setting bit lines corresponding selected memory cells along the first word line to a low supply level and setting bit lines corresponding to non-selected memory cells along the first word line to a program inhibit level;
subsequently applying to a set of one or more word lines including the first word line a waveform rising from the low supply level to a first voltage level; and
for each bit lines corresponding to selected memory cells along the first word line, raising the bit line from the low supply level to a second voltage level at a level of the waveform based on the selected memory cell's target state, the second voltage level being sufficient to turn off the corresponding select gate.

12. The method of claim 11, wherein the set of one or more word lines includes the first word line and a word line adjacent to the first word lines.

13. The method of claim 11, wherein the second voltage level is intermediate to low supply level and program inhibit level.

14. The method of claim 11, wherein the programming further includes a program verify prior to biasing the memory array, and wherein the non-selected memory cells along the first word lines includes one or more memory cells having verified as programmed to a corresponding target state.

15. The method of claim 14, wherein the level of the waveform at which the bit lines corresponding to a selected memory cells along the first word line is raised from the low supply level to second voltage level is further based on a result of the verify.

16. The method of claim 11, wherein the waveform is a staircase waveform rising from the low supply level to a first voltage level in a plurality of steps.

17. The method of claim 16, wherein the number of steps is the same as the number of target states.

18. The method of claim 16, wherein the staircase waveform is dependent upon the location of the first word line within the memory array.

19. The method of claim 16, wherein the program pulse is one of series of program pulses and the staircase waveform is dependent on the number of the program pulse within the series.

20. An apparatus, comprising:

one or more NAND strings in which memory cells are connected along word lines and in which the memory cells of each NAND string are connected through a select gate to a corresponding bit line; and
means connected to the word lines and bit lines for concurrently programming a plurality of memory cells along a first word line from an initial state to one of a plurality of target states in which the programming includes biasing of the NAND strings and subsequently applying a program pulse to the first word line of the biased NAND strings,
wherein the biasing includes setting bit lines corresponding to non-selected memory cells along the first word line to a program inhibit level and setting bit lines corresponding selected memory cells along the first word line to a low supply level; subsequently applying to a set of one or more word lines including the first word line a voltage that rises from the low supply level to a first voltage level; and, for bit lines corresponding to selected memory cells along the first word line, raising the bit line from the low supply level to a second voltage level having a magnitude sufficient to turn off the corresponding select gate at a level of the voltage applied to the set of one or more word lines that is based on the selected memory cell's target state.

* * * * *

UNITED STATES PATENT AND TRADEMARK OFFICE
CERTIFICATE OF CORRECTION

PATENT NO. : 9,842,657 B1  Page 1 of 1
APPLICATION NO. : 15/599243
DATED : December 12, 2017
INVENTOR(S) : Dutta et al.

It is certified that error appears in the above-identified patent and that said Letters Patent is hereby corrected as shown below:

In the Claims

Column 27, Line 18, Claim 6: After "memory" and before "along" delete "cells" and replace with -- cell --.

Column 27, Line 31, Claim 10: After ""NAND" and before "are" delete "string" and replace with -- strings --.

Column 28, Line 20, Claim 15: After "memory" and before "along" delete "cells" and replace with -- cell --.

Signed and Sealed this
Twenty-second Day of May, 2018

Andrei Iancu
*Director of the United States Patent and Trademark Office*